(12) United States Patent
Vezyrtzis et al.

(10) Patent No.: US 10,230,360 B2
(45) Date of Patent: Mar. 12, 2019

(54) INCREASING RESOLUTION OF ON-CHIP TIMING UNCERTAINTY MEASUREMENTS

(71) Applicant: International Business Machines Corporation, Armonk, NY (US)

(72) Inventors: Christos Vezyrtzis, New Rochelle, NY (US); Pawel Owczarczyk, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/624,992

(22) Filed: Jun. 16, 2017

(65) Prior Publication Data
US 2018/0367128 A1    Dec. 20, 2018

(51) Int. Cl.
*H03K 5/15* (2006.01)
*H03K 3/037* (2006.01)
*H03K 5/19* (2006.01)

(52) U.S. Cl.
CPC ......... *H03K 5/1508* (2013.01); *H03K 3/0372* (2013.01); *H03K 5/1502* (2013.01); *H03K 5/19* (2013.01)

(58) Field of Classification Search
None
See application file for complete search history.

(56) References Cited

U.S. PATENT DOCUMENTS

| | | | |
|---|---|---|---|
| 7,576,569 B2 | 8/2009 | Carpenter et al. | |
| 7,884,751 B2 | 2/2011 | Shimizu et al. | |
| 7,944,229 B2 | 5/2011 | Joshi et al. | |
| 8,174,293 B2 | 5/2012 | Yoshihara et al. | |
| 8,228,106 B2 * | 7/2012 | Baumann | H03K 5/135 327/278 |
| 8,362,932 B2 | 1/2013 | Pavlovic et al. | |
| 8,405,413 B2 | 3/2013 | Carpenter et al. | |

(Continued)

FOREIGN PATENT DOCUMENTS

| CN | 103839590 A | 6/2014 |
|---|---|---|
| CN | 104753524 A | 7/2015 |

OTHER PUBLICATIONS

International Search Report and Written Opinion for International Application No. PCT/IB2018/054109 dated Oct. 25, 2018.

*Primary Examiner* — Cassandra Cox
(74) *Attorney, Agent, or Firm* — Jared C. Chaney

(57) ABSTRACT

The present invention provides a system and method of increasing the resolution of on-chip timing uncertainty measurements. In an embodiment, the system includes a set of delay circuits logically coupled in a chain configuration, a plurality of flip-flop circuits logically coupled to the delay output of the each of the delay circuits respectively, forming tiers of flip-flop circuits, a clock circuit logically coupled to each of the tiers of flip-flop circuits respectively, and where the plurality of flip-flop circuits is logically configured, in response to a delay input of a first delay circuit in the set of delay circuits receiving an output from a programmable delay circuit and in response to receiving skewed clock signals from the clock circuits, to indicate how far within the plurality of flip-flop circuits an edge signal transmitted from the delay output of the each of the delay circuits propagated, respectively.

16 Claims, 10 Drawing Sheets

(56) References Cited

U.S. PATENT DOCUMENTS

| | | | |
|---|---|---|---|
| 8,570,082 B1 * | 10/2013 | Kuo | H03L 1/00 327/158 |
| 8,633,722 B1 * | 1/2014 | Lai | H03K 19/17764 324/750.3 |
| 8,866,527 B1 | 10/2014 | Lewis | |
| 8,941,426 B1 | 1/2015 | Drake et al. | |
| 9,104,181 B1 | 8/2015 | Jung et al. | |
| 9,223,295 B2 | 12/2015 | Tiner et al. | |
| 9,568,548 B1 | 2/2017 | Franch et al. | |
| 2009/0175399 A1 * | 7/2009 | Sun | H03L 7/0802 375/376 |
| 2013/0271196 A1 | 10/2013 | Cao et al. | |

* cited by examiner

INCREASING RESOLUTION OF ON-CHIP TIMING UNCERTAINTY MEASUREMENTS

BACKGROUND

The present disclosure relates to computer chips, and more specifically, to increasing the resolution of on-chip timing uncertainty measurements.

SUMMARY

The present invention provides a system and method of increasing the resolution of on-chip timing uncertainty measurements. In an exemplary embodiment, the system includes (1) a set of delay circuits logically coupled in a chain configuration, (a) where each of the delay circuits includes a delay input and a delay output, (b) where the delay input of a first delay circuit in the set is logically coupled to a programmable delay circuit output of a programmable delay circuit, (c) where the delay input of a second delay circuit in the set is logically coupled to the delay output of the first delay circuit, (d) where the delay input of each of the remaining delay circuits in the set is logically coupled to the delay output of an immediately previous delay circuit in the set, (2) a plurality of flip-flop circuits logically coupled to the delay output of the each of the delay circuits respectively, forming tiers of flip-flop circuits, (a) where each of the flip-flop circuits includes a flip-flop input, a clock input, and a flip-flop output, (b) where the flip-flop input of the each of the plurality of flip-flop circuits is logically coupled to the delay output of the each of the delay circuits respectively, (3) a clock circuit logically coupled to each of the tiers of flip-flop circuits respectively, (a) where a clock output of the clock circuit is logically coupled to the clock input of each flip-flop circuit in the each of the tiers of flip-flop circuits, (b) where the clock circuit is logically configured to transmit a skewed clock signal including a programmable delay from the clock output of the clock circuit to the clock input of the each flip-flop circuit in the each of the tiers of flip-flop circuits, resulting in skewed clock signals including corresponding programmable delays being transmitted by clock circuits to the tiers of flip-flop circuits respectively, and (4) where the plurality of flip-flop circuits is logically configured, in response to receiving an output from the delay output of the each of the delay circuits on the flip-flop input of the each of the plurality of flip-flop circuits in response to the delay input of the first delay circuit in the set of delay circuits receiving an output from the programmable delay circuit output of the programmable delay circuit and in response to receiving the skewed clock signals from the clock circuits on the clock input of the each flip-flop circuit in the each of the tiers of flip-flop circuits, to indicate, via the flip-flop outputs of the plurality of flip-flop circuits, how far within the plurality of flip-flop circuits an edge signal transmitted from the delay output of the each of the delay circuits propagated, respectively.

In an exemplary embodiment, the method includes (1) receiving an output from a programmable delay circuit output of a programmable delay circuit on a delay input of a first delay circuit in a set of delay circuits logically coupled in a chain configuration, (2) in response to the delay input of the first delay circuit in the set of delay circuits receiving the output from the programmable delay circuit output of the programmable delay circuit, receiving an output from a delay output of each of the delay circuits on a flip-flop input of each of a plurality of flip-flop circuits, where the plurality of flip-flop circuits forms tiers of flip-flop circuits, (3) transmitting by a clock circuit to each of the tiers of flip-flop circuits a skewed clock signal comprising a programmable delay from a clock output of the clock circuit to a clock input of each flip-flop circuit in the each of the tiers of flip-flop circuits, resulting in skewed clock signals including corresponding programmable delays being transmitted by clock circuits to the tiers of flip-flop circuits respectively, and (4) in response to receiving the output from the delay output of the each of the delay circuits on the flip-flop input of the each of the plurality of flip-flop circuits and in response to receiving the skewed clock signals from the clock circuits on the clock input of each flip-flop circuit in the each of the tiers of flip-flop circuits, indicating by the plurality of flip-flop circuits, via flip-flop outputs of the plurality of flip-flop circuits, how far within the plurality of flip-flop circuits an edge signal transmitted from the delay output of the each of the delay circuits propagated, respectively.

In an alternative embodiment, the method includes (1) receiving an output from a programmable delay circuit output of a programmable delay circuit on a delay input of a first delay circuit in a set of delay circuits logically coupled in a chain configuration, (2) in response to the delay input of the first delay circuit in the set of delay circuits receiving the output from the programmable delay circuit output of the programmable delay circuit, receiving an output from a delay output of each of the delay circuits on a flip-flop input of each of a plurality of flip-flop circuits, where the plurality of flip-flop circuits forms tiers of flip-flop circuits, and (3) in response to receiving the output from the delay output of the each of the delay circuits on the flip-flop input of the each of the plurality of flip-flop circuits and in response to receiving skewed clock signals from clock circuits on a clock input of each flip-flop circuit in the each of the tiers of flip-flop circuits, indicating by the plurality of flip-flop circuits, via flip-flop outputs of the plurality of flip-flop circuits, how far within the plurality of flip-flop circuits an edge signal transmitted from the delay output of the each of the delay circuits propagated, respectively.

DETAILED DESCRIPTION

Figure 1:
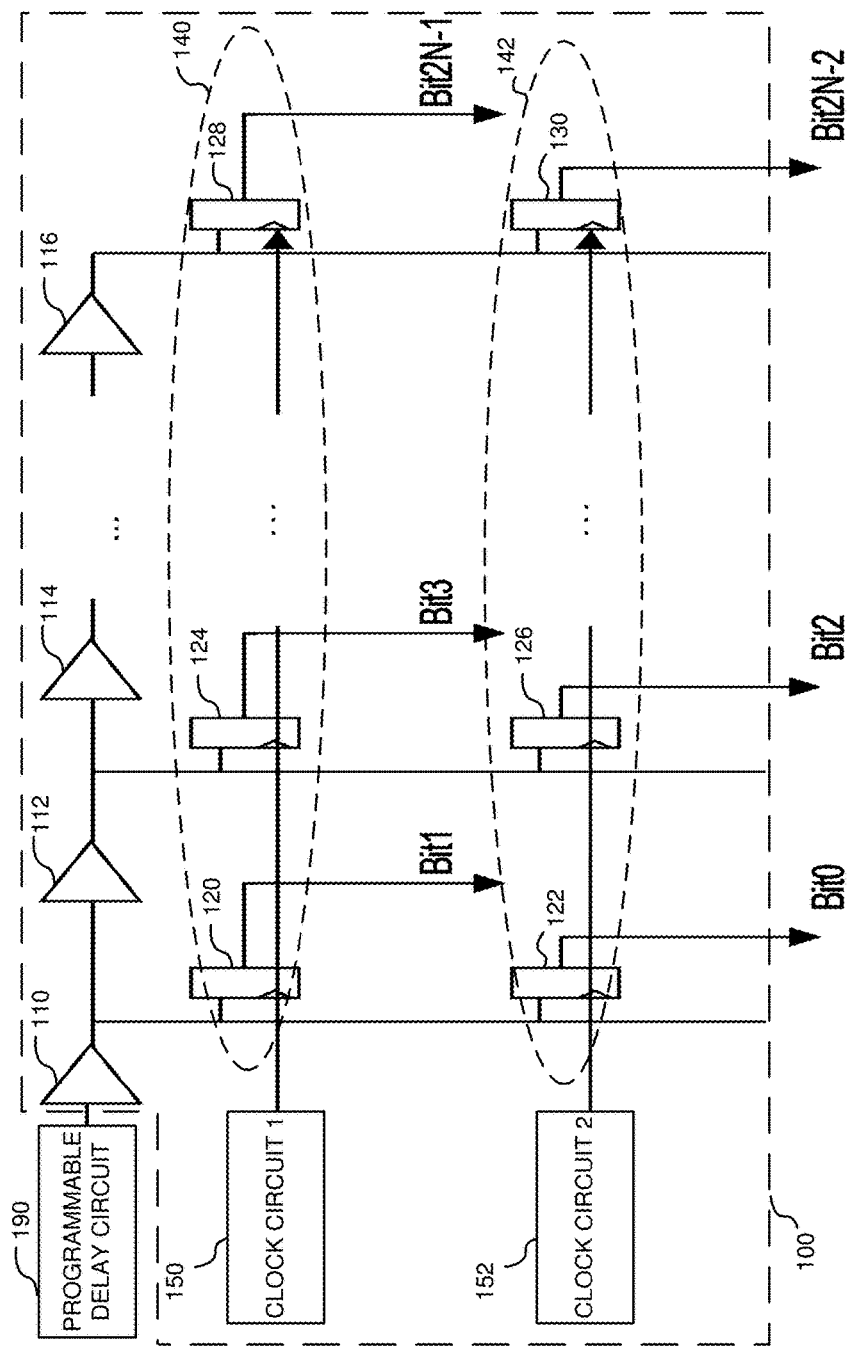
FIG. 1 depicts a block diagram in accordance with an exemplary embodiment of the present invention.

The present invention provides a system and method of increasing the resolution of on-chip timing uncertainty measurements. In an exemplary embodiment, the system includes (1) a set of delay circuits logically coupled in a chain configuration, (a) where each of the delay circuits includes a delay input and a delay output, (b) where the delay input of a first delay circuit in the set is logically coupled to a programmable delay circuit output of a programmable delay circuit, (c) where the delay input of a second delay circuit in the set is logically coupled to the delay output of the first delay circuit, (d) where the delay input of each of the remaining delay circuits in the set is logically coupled to the delay output of an immediately previous delay circuit in the set, (2) a plurality of flip-flop circuits logically coupled to the delay output of the each of the delay circuits respectively, forming tiers of flip-flop circuits, (a) where each of the flip-flop circuits includes a flip-flop input, a clock input, and a flip-flop output, (b) where the flip-flop input of the each of the plurality of flip-flop circuits is logically coupled to the delay output of the each of the delay circuits respectively, (3) a clock circuit logically coupled to each of the tiers of flip-flop circuits respectively, (a) where a clock output of the clock circuit is logically coupled to the clock input of each flip-flop circuit in the each of the tiers of flip-flop circuits, (b) where the clock circuit is logically configured to transmit a skewed clock signal including a programmable delay from the clock output of the clock circuit to the clock input of the each flip-flop circuit in the each of the tiers of flip-flop circuits, resulting in skewed clock signals including corresponding programmable delays being transmitted by clock circuits to the tiers of flip-flop circuits respectively, and (4) where the plurality of flip-flop circuits is logically configured, in response to receiving an output from the delay output of the each of the delay circuits on the flip-flop input of the each of the plurality of flip-flop circuits in response to the delay input of the first delay circuit in the set of delay circuits receiving an output from the programmable delay circuit output of the programmable delay circuit and in response to receiving the skewed clock signals from the clock circuits on the clock input of the each flip-flop circuit in the each of the tiers of flip-flop circuits, to indicate, via the flip-flop outputs of the plurality of flip-flop circuits, how far within the plurality of flip-flop circuits an edge signal transmitted from the delay output of the each of the delay circuits propagated, respectively. In a particular embodiment, the each of the delay circuits includes at least two inverter circuits. In a specific embodiment, each of the delay circuits includes at least two inverter circuits. In a particular embodiment, the skewed clock signals have a common frequency, and each of the skewed clock signals has a different arrival time (skew) as determined by a corresponding programmable delay. In a specific embodiment, the flip-flop circuits are master-slave digital logic elements that capture data on their flip-flop inputs when the flip-flop circuits receive a rising edge on their clock inputs/clock ports.

In an exemplary embodiment, the method includes (1) receiving an output from a programmable delay circuit output of a programmable delay circuit on a delay input of a first delay circuit in a set of delay circuits logically coupled in a chain configuration, (2) in response to the delay input of the first delay circuit in the set of delay circuits receiving the output from the programmable delay circuit output of the programmable delay circuit, receiving an output from a delay output of each of the delay circuits on a flip-flop input of each of a plurality of flip-flop circuits, where the plurality of flip-flop circuits forms tiers of flip-flop circuits, (3) transmitting by a clock circuit to each of the tiers of flip-flop circuits a skewed clock signal comprising a programmable delay from a clock output of the clock circuit to a clock input of each flip-flop circuit in the each of the tiers of flip-flop circuits, resulting in skewed clock signals including corresponding programmable delays being transmitted by clock circuits to the tiers of flip-flop circuits respectively, and (4) in response to receiving the output from the delay output of the each of the delay circuits on the flip-flop input of the each of the plurality of flip-flop circuits and in response to receiving the skewed clock signals from the clock circuits on the clock input of each flip-flop circuit in the each of the tiers of flip-flop circuits, indicating by the plurality of flip-flop circuits, via flip-flop outputs of the plurality of flip-flop circuits, how far within the plurality of flip-flop circuits an edge signal transmitted from the delay output of the each of the delay circuits propagated, respectively.

In an alternative embodiment, the method includes (1) receiving an output from a programmable delay circuit output of a programmable delay circuit on a delay input of a first delay circuit in a set of delay circuits logically coupled in a chain configuration, (2) in response to the delay input of the first delay circuit in the set of delay circuits receiving the output from the programmable delay circuit output of the programmable delay circuit, receiving an output from a delay output of each of the delay circuits on a flip-flop input of each of a plurality of flip-flop circuits, where the plurality of flip-flop circuits forms tiers of flip-flop circuits, and (3) in response to receiving the output from the delay output of the each of the delay circuits on the flip-flop input of the each of the plurality of flip-flop circuits and in response to receiving skewed clock signals from clock circuits on a clock input of each flip-flop circuit in the each of the tiers of flip-flop circuits, indicating by the plurality of flip-flop circuits, via flip-flop outputs of the plurality of flip-flop circuits, how far within the plurality of flip-flop circuits an edge signal transmitted from the delay output of the each of the delay circuits propagated, respectively.

Definitions

Power Supply Voltage and Noise Monitors

Signal propagation delays through logic circuits vary with the power supply, and as a result $T_{cmin}$ ($f_{max}$) varies with $V_{DD}$. Local variations in $V_{DD}$ may occur because of IR (current×resistance) drops associated with series resistance in the power grid. Local variations in $V_{DD}$ may also occur because of LdI/dt effects/noise when the chip suddenly pulls more current, where the package inductance on the power supply pins causes such a droop. Temporal variations in local $V_{DD}$ values occur as circuit switching activities and the current drawn fluctuate over time. Such variations in $V_{DD}$ are tracked over time with on-chip monitors, as a dip in $V_{DD}$ may lower $f_{max}$ and be the root cause of a timing fail.

Chip timing, $T_{cmin}$ and $f_{max}$ are affected by local clock skew, variations in duty cycle and jitter at the clock edges. Any change in $V_{DD}$ may also impact clock path delays. These affect the timing of the clock signals for launch and capture at clocked storage elements such as latches and flip-flops. Signal-to-signal coupling may also affect waveform shapes and signal propagation delays.

It is difficult to separate and quantify each of these effects by location on the chip and time of occurrence. Monitors are designed to capture the net effect of power supply, clock, and noise in critical locations on the chip. Time-based sensors are used in many integrated circuits, in order to monitor things like a voltage value, jitter of a digital clock and others. Such sensors include SKITTER and Critical-Path-Monitors, which employ chains of digital delay blocks and latches, and sense the input by counting the number of delay stages that a signal propagated at every clock cycle.

Clock Skew and Jitter (SKITTER) Monitors

A clock skew and jitter (SKITTER) monitor includes a tapped delay chain/line configured to function as an edge detector. In response to a clock signal being inputted to the first delay in the tapped delay chain, two consecutive logical "1"s and two consecutive logical "0"s indicate the locations of the clock signal's rising and falling edges, respectively. The output nodes of the delay line are tapped and fed into edge-triggered latches. The outputs of neighboring latches drive XNOR2 circuits such that two consecutive logical "1"s or two consecutive logical "0"s in the delay line result in a logical "1" from the corresponding XNOR2 circuit.

For example, for a ten inverter section of such a delay chain, an output bit pattern of 10000010 would indicate two edges in the delay chain at the time the snapshot was taken via the latches triggered by another input clock signal to the latches, where the output may be read in real time or stored in register files to be scanned out at a later time. With a sufficiently long delay chain, three clock edges may be captured, and the clock duty cycle estimated from the output bit pattern. The accuracy of clock edge location in time is on the order of an inverter delay. For example, with an inverter delay of 7 picoseconds and a clock cycle time of 250 picoseconds (4 gigahertz), the worst case error estimate for a full cycle would be 6%. Noise in the clock distribution tree, phase lock loop jitter, and other variations can cause jitter in the clock edges. With additional circuitry, the movement of the clock edged over may be captured.

The time calibration of the SKITTER is accomplished by sending a clock signal while the chip is in an inactive state. The clock cycle divided by the number of bits in the cycle from the SKITTER gives the inverter delay per stage in picoseconds (i.e., the time resolution per bit). Next, the inverter delay is measured over a range of $V_{DD}$ values, centered about the nominal $V_{DD}$. A linear fit of the data gives $\Delta V_{DD}$ in units of number of bits. The shift in clock edge due to a $V_{DD}$ droop could then be used to estimate the magnitude of the shift in $V_{DD}$.

Critical Path Monitors (CPMs)

A critical path monitor (CPM) combined the functions of silicon process monitors with those of voltage, jitter, and noise monitors in a single unit. Dynamic measurements of path delays on a chip and comparisons of the measured delays with initial calibration data stored on the chip provide information on delay changes with time due to temperature, voltage, noise, and aging effects. This information could be used to manage power and clock frequency for optimum performance. For example, a CPM may include a signal generator to launch a clock pulse on a delay path and an edge detector to convert the path delay to digital bits. Initial measurement on the delay path could be made with minimum switching activity on the chip, and the data could be stored for tracking changes at later times. Thereafter, the path delay could be measured at predetermined intervals when the chip is in functional mode. Afterwards, the dynamic path delay measurements could be compared with an initial calibration, such that any significant changes could be used for adjusting system operation parameters for optimum power and frequency.

The circuit concept of a CPM could be expanded to include several delay paths configured to represent different circuit topologies or circuit blocks with high sensitivity to $f_{max}$ ($T_{cmin}$) for a specific chip design. The delay path configuration could provide flexibility to accommodate a variety of such delay paths. Unique paths could be created by emulating a hybridized combinational circuit block. Deploying CPMs with analysis capability and feedback control on complementary metal-oxide-semiconductor (CMOS) chips has three key advantages (i) customized path configurations could mimic critical path and $f_{max}$ behavior, (ii) dynamic read out could enable tracking circuit performance during functional operation and over the lifetime of a CMOS circuit, and (iii) real-time feedback from the CPM could be used to tune application conditions ($V_{DD}$, $T_c$) for optimum power/performance trade-offs over time.

A CPM monitors timing margin or voltage for a digital circuit, with a sensor including an inverter chain and latches. The input of the CPM is a rising edge (arriving late in the clock cycle), coming from a tuned delay/programmable delay circuit. The output of the CPM is a "thermometer code" (e.g., 11 . . . 11100 . . . 0), indicating how late the edge arrived.

Inverters/Inverter Circuits

An inverter/inverter circuit/NOT gate is a logic gate which implements logical negation. An inverter circuit outputs a voltage representing the opposite logic-level to its input where its main function being to invert the input signal applied such that if the applied input is low then the output becomes high and vice versa. Inverters can be constructed using a single N-type metal-oxide-semiconductor (NMOS) transistor or a single P-type metal-oxide-semiconductor (PMOS) (p-MOS) transistor coupled with a resistor such that since this "resistive-drain" approach uses only a single type of transistor, it can be fabricated at low cost. However, because current flows through the resistor in one of the two states, the resistive-drain configuration is disadvantaged for power consumption and processing speed. Alternatively, inverters can be constructed using two complementary transistors in a CMOS configuration where this configuration greatly reduces power consumption since one of the transistors is always off in both logic states and where processing speed can also be improved due to the relatively low resistance compared to the NMOS-only or PMOS-only type devices. Inverters can also be constructed with bipolar junction transistors (BJT) in either a resistor-transistor logic (RTL) or a transistor-transistor logic (TTL) configuration. Digital electronics circuits operate at fixed voltage levels corresponding to a logical 0 or 1, such that an inverter circuit serves as the basic logic gate to swap between those two voltage levels, where implementation determines the actual voltage, but common levels include (0, +5V) for TTL circuits.

Flip-Flops/Flip-Flop Circuits

A flip-flop/flip-flop circuit is a circuit that has two stable states, can be used to store state information, and is a bistable multivibrator. A flip-flop can be made to change state by signals applied to one or more control inputs and will have one or two outputs. A flip-flop stores a single bit (binary digit) of data such that one of its two states represents a "one" and the other represents a "zero". For a flip-flop, when used in a finite-state machine, the output and next state depend not only on its current input, but also on its current state (and hence, previous inputs). A flip-flop can also be used for counting of pulses, and for synchronizing variably-timed input signals to some reference timing signal. Flip-flops are clocked (synchronous or edge-triggered (i.e., edge-sensitive) such that a flip flop's output only changes on a single type (positive going or negative going) of clock edge. Flip-flops, as clocked devices, are specially designed for synchronous systems such that flip-flops ignore their inputs except at the transition of a dedicated clock signal (known as clocking, pulsing, or strobing). Clocking causes the flip-flop either to change or to retain its output signal based upon the values of the input signals at the transition where some flip-flops change output on the rising edge of the clock, others on the falling edge. Flip-flops are master-slave digital logic elements that capture data when they receive a rising edge/falling edge at their clock ports/inputs.

Latches

A latch/is a digital hardware memory element with two Boolean inputs (data and clock) and one Boolean output. For such a latch, when its clock input is a certain value (e.g., a logical 1), the value at its data input will be propagated to its data output (i.e., transparent mode); otherwise, its last propagated value is held at its output. The clock may be modeled as a signal which alternates between 0 and 1 at every time-step. A latch which samples when the clock is a 1 may be denoted as an L1 latch, while a latch which samples when the clock is a 0 may be denoted as an L2 latch. A type of digital design style requires each L1 latch to feed directly to an L2 latch (called a master-slave latch pair), and allow only L2 to drive combinatorial logic. A latch is level-sensitive, such that when a latch is enabled it becomes transparent/asynchronous.

Clock Signals and Clock Circuits

A clock signal is a particular type of signal that oscillates between a high and a low state and is utilized like a metronome to coordinate actions of digital circuits, where the clock signal is produced by a clock generator/clock circuit. Although more complex arrangements are used, the most common clock signal is in the form of a square wave with a 50% duty cycle, usually with a fixed, constant frequency. Circuits using the clock signal for synchronization may become active at either the rising edge, falling edge, or, in the case of double data rate, both in the rising and in the falling edges of the clock cycle. Most integrated circuits (ICs) of sufficient complexity use a clock signal in order to synchronize different parts of the circuit, cycling at a rate slower than the worst-case internal propagation delays. As ICs become more complex (e.g., microprocessors), the problem of supplying accurate and synchronized clocks to all the circuits becomes increasingly difficult.

The most effective way to get the clock signal to every part of a chip that needs it, with the lowest skew, is a metal grid/tree/serpentine/spine. In a large microprocessor, the power used to drive the clock signal can be over 30% of the total power used by the entire chip. The whole structure with the gates at the ends and all amplifiers in between have to be loaded and unloaded every cycle, such that in order to save energy, clock gating is used to temporarily shut off part of the tree. The clock distribution network (or clock tree, when this network forms a tree) distributes the clock signal(s) from a common point to all the elements that need it.

Clock signals have some very special characteristics and attributes. Clock signals are typically loaded with the greatest fanout and operate at the highest speeds of any signal within the synchronous system. Since the data signals are provided with a temporal reference by the clock signals, the clock waveforms must be particularly clean and sharp. Furthermore, these clock signals are particularly affected by technology scaling, in that long global interconnect lines become significantly more resistive as line dimensions are decreased such that such increased line resistance is one of the primary reasons for the increasing significance of clock distribution on synchronous performance. Finally, the control of any differences and uncertainty in the arrival times of the clock signals could severely limit the maximum performance of the entire system and could create catastrophic race conditions in which an incorrect data signal may latch within a register.

Clock Uncertainty/Timing Uncertainty

Clock uncertainty is the uncertainty in time in which a clock edge will appear and is determined by clock skew, clock jitter and clock overhead. Clock uncertainty can have detrimental effects on the viability of a digital circuit/chip design, such as (i) min-delay (hold) failures being frequency independent resulting in needing to discard the affected chip and (ii) max-delay (setup) failures are frequency dependent resulting in selling a chip at a lower operating frequency.

Clock Skew

Clock skew (sometimes called timing skew) is a phenomenon in synchronous digital circuit systems (such as computer systems) in which the same sourced clock signal arrives at different components at different times. The operation of most digital circuits is synchronized by a periodic signal known as a "clock" that dictates the sequence and pacing of the devices on the circuit where this clock is distributed from a single source to all the memory elements of the circuit, which for example could be registers or flip-flops. In a circuit using edge-triggered registers, when the clock edge or tick arrives at a register, the register transfers the register input to the register output, and these new output values flow through combinational logic to provide the values at register inputs for the next clock tick. Ideally, the input to each memory element reaches its final value in time for the next clock tick so that the behavior of the whole circuit can be predicted exactly. The maximum speed at which a system can run must account for the variance that occurs between the various elements of a circuit due to differences in physical composition, temperature, and path length. In a synchronous circuit, two registers, or flip-flops, are said to be "sequentially adjacent" if a logic path connects them. Given two sequentially-adjacent registers $R_i$ and $R_j$ with clock arrival times at destination and source register clock pins equal to $T_{Ci}$ and $T_{Cj}$ respectively, clock skew can be defined as: $T_{skew\,i,j} = T_{Ci} - T_{Cj}$. Clock skew represents the difference in delay of two identical clock signals arriving at two different locations on the chip (spatial separation). Clock skew could result in a single transition of the core clock not arriving at all latches or flip-flops at the same time.

Clock skew can be caused by many different things (e.g., wire-interconnect length, temperature variations, variation in intermediate devices, capacitive coupling, material imperfections, differences in input capacitance on the clock inputs of devices using the clock) such that as the clock rate of a circuit increases, timing becomes more critical and less variation can be tolerated if the circuit is to function properly. Two types of clock skew exist. One type, positive skew, occurs when the transmitting register receives the clock tick earlier than the receiving register. The other type, negative skew, occurs when the receiving register gets the clock tick earlier than the sending register. Zero clock skew refers to the arrival of the clock tick simultaneously at transmitting and receiving register. Clock skew can be intentional or unintentional. For example, intentional clock skew could be injected into a clock signal in order to fix a race condition in a block of logic, typically achieved by the use of a variable delay clock regeneration buffer.

Clock Jitter

Clock jitter/jitter is the clock edge inaccuracy introduced by the clock signal generation circuitry. Clock jitter could be viewed as a statistical variation of the clock period or duty cycle. Clock jitter could cause the clock frequency at any point in the clock tree to not be constant. The worst case jitter could determine usable clock cycle time.

Jitter is the deviation from true periodicity of a presumably periodic signal, often in relation to a reference clock signal, where in clock recovery applications, jitter is called timing jitter. Jitter can be quantified in the same terms as all time-varying signals (e.g., root mean square (RMS), or peak-to-peak displacement). Also like other time-varying signals, jitter can be expressed in terms of spectral density. Jitter period is the interval between two times of maximum effect (or minimum effect) of a signal characteristic that varies regularly with time. Jitter frequency, the more commonly quoted figure, is its inverse, where jitter frequencies below 10 hertz as wander and frequencies at or above 10 hertz as jitter. Jitter may be caused by electromagnetic interference and crosstalk with carriers of other signals. Jitter can cause a display monitor to flicker, affect the performance of processors in personal computers, introduce clicks or other undesired effects in audio signals, and cause loss of transmitted data between network devices, where the amount of tolerable jitter depends on the affected application.

For clock jitter, three commonly used metrics used to measure jitter are absolute jitter, period jitter, and cycle to cycle jitter. Absolute jitter refers to the absolute difference in the position of a clock's edge from where it would ideally be. Period jitter (i.e., cycle jitter) refers to the difference between any one clock period and the ideal or average clock period, where period jitter tends to be important in synchronous circuitry such as digital state machines where the error-free operation of the circuitry is limited by the shortest possible clock period (average period less maximum cycle jitter), and the performance of the circuitry is set by the average clock period such that synchronous circuitry benefits from minimizing period jitter, so that the shortest clock period approaches the average clock period. Cycle-to-cycle jitter refers to the difference in duration of any two adjacent clock periods and can be important for some types of clock generation circuitry used in microprocessors and random access memory (RAM) interfaces.

Clock Overhead

Clock overhead refers to the time a sequential storage element needs to positively store (or resolve) the incoming data. Clock overhead is directly related to the metastability properties of the sequential storage element.

Clock Buffers

In certain clock networks (e.g., tree, grid, and serpentine clock networks), the clock signals need to be buffered (regenerated) to ensure satisfactory edge rates and reduce skew. Global clock buffers (GCBs) are used to regenerate the clock signal(s) to a region or cluster in the chip and are typically designed with skew adjustment control. Local clock buffers/local clock buffer circuits (LCBs) are used to regenerate the clock signal(s) to functional blocks in each cluster, where an LCB usually contains logic which allow the clock signals to be gated on or off to reduce power.

Pass Transistor Logic/Pass Gate Circuits

Pass transistor logic (PTL)/pass gate circuits reduces the count of transistors used to make different logic gates, by eliminating redundant transistors such that transistors are used as switches to pass logic levels between nodes of a circuit, instead of as switches connected directly to supply voltages, resulting in reducing the number of active devices. The pass transistor is driven by a periodic clock signal and acts as an access switch to either charge up or charge down the parasitic capacitance $C_x$, depending on the input signal $V_{in}$. Thus, the two possible operations when the clock signal is active (CK=1) are the logic "1" transfer (charging up the capacitance $C_x$ to a logic-high level) and the logic "0" transfer (charging down the capacitance $C_x$ to a logic-low level). In either case, the output of the depletion load nMOS inverter assumes a logic-low or a logic-high level, depending upon the voltage $V_x$.

Complementary pass transistor logic (CPL) may use transmission gates composed of both NMOS and PMOS pass transistors. For example, CPL implements logic gates such that each gate consists of a NMOS-only pass transistor network, followed by a CMOS output inverter. CPL could also implement logic gates using dual-rail encoding such that every CPL gate has two output wires, both the positive signal and the complementary signal, eliminating the need for inverters. CPL could also use series transistors to select between possible inverted output values of the logic, the output of which drives an inverter, where the CMOS transmission gates consist of nMOS and pMOS transistor connected in parallel.

Dummy Loads/Dummy Load Circuits

A dummy load/dummy load circuit is a device used to simulate an electrical load, usually for testing purposes.

Problems with SKITTER Monitors and CPMs

CPMs have limitations which should be considered in selecting a CPM design and its overlaps with other monitors on chip. For example, electronic design automation (EDA) timing tools used for present day chip designs try to equalize the delay of all paths by appropriately sizing the transistors, such that if a path has positive slack (fast path), the transistor widths of the gates in the path are tuned to decrease power while still meeting the cycle time, resulting no single path dominating $T_{cmin}$, leading to difficulty in identifying a single representative critical path.

Also, the resolution of SKITTER monitors and CPMs (i.e., the minimum amount of a signal variation that they can sense by producing a different digital output) is limited by the delay of the delay gates (inverter pairs) that are used in such monitors, which is in turn limited by the process technology. The resolution of such time-based sensors is the minimum amount of time of the signal propagation that will change the state of the capturing latches of the sensors. Such time bases sensors have limited resolution in CPM or SKITTER (for timing uncertainty/clock skew monitoring). If the signal propagation across the delay chain were to change by enough time (due to power supply voltage, making the delays faster) so that the signal travels down one additional delay block, then such change could be captured in the latches of the sensors. However, if the signal propagation were to change only by a small amount, the signal may not travel down an entire additional delay block, such that no output in the latches of the sensors would be observed.

In droop detection, a sensor (e.g., CPM) detects the onset of a droop, and after a lag/latency, a solution is applied to the circuits to solve the problem. The droop (reduced supply voltage) make the circuits slower. With a smaller the lag/latency, the smaller the probability of the circuits entering a problem zone (i.e., the case where the circuits become too slow). If a circuit were to enter the problem zone as determined by current CPMs, the designer of the chip would compensate by raising the power supply voltage (at the cost of increased power) such that after such compensation, the circuit would be no longer in danger of entering the problem zone. Therefore, smaller lag could lead to entering less deep into the problem zone, resulting in less compensation being needed.

The role of the CPM is to find out when a digital logic chip is about to enter the problem zone. In light of information indicating when the chip is about to enter the problem zone, the chip would use this information and would apply some counter-measure so that the chip would exit the problem zone. The counter-measures may include (but are not limited to) (i) adaptive clocking (i.e., the clock is slowed down so that the circuits could have more time to work, so that the circuits' slowing-down could be compensated), and (2) instruction throttling (i.e., the chip stops doing work so that no timing errors can occur, and the chip current is reduced, so that the chip would exit the problem zone).

When using CPM as a voltage sensor, the lag is dependent on the CPM resolution. Thus, finer resolution could lead to smaller lag. Therefore, there is a need for finer resolution in time-based sensors for digital circuits. A CPM senses all the time, but reports a problem when the $V_{DD}$ is small enough so that the CPM indication is smaller than a pre-determined threshold value by one, two or more units/levels, such that finer resolution leads to a smaller amount of voltage needed to make a 1-level (or 2-level or more) difference and leads to a smaller sensing lag. The "resolution" of the inverter chain (the delay of each stage) of the CPM could be limited to the order of 5 picoseconds, because of the inverter delay of the inverters of the CPM.

Problems with Extended Cycle Times for CPMs

Operating a CPM at an extended cycle time (e.g., 2/3/4 cycles) to increase resolution also present problems. For example, such a scheme would require 4 cycles to get less than 1% resolution. Also, for example, if the voltage sensor (CPM) were allowed to provide one new margin/voltage value only every 3 cycles, then CPM could result in a higher resolution. However, such a scheme could lead to CPM latency, involving a longer time to output a new sample from the CPM, increased latency while droop is happening could move mitigation later. In other words, the scheme could result in fewer measurements for the margin/voltage such that the sample from the CPM that detects (at some point) the emergency could be considered to be delayed (with respect to the case of popping up 1 sample every cycle. When using CPM as a voltage sensor, the lag is dependent on the CPM resolution. Thus, finer resolution could lead to smaller lag. Therefore, there is a need for finer resolution.

In addition, such a scheme could lead to the CPM providing an "average voltage value", such that the reading (at the end of the extended CPM cycle) may not be the right one for droop mitigation since it could be less accurate and more optimistic in a droop situation. In other words, the CPM sensor could have an inherent property of measuring the average margin/voltage value such that having the CPM acquire one sample every 3 cycles could result in a value at the middle of the interval (which for the case of a fast-dropping supply voltage would be an optimistic measurement).

System

Referring to FIG. 1, in an exemplary embodiment, the present invention provides a system 100 of increasing the resolution of on-chip timing uncertainty measurements. In an exemplary embodiment, the system includes (1) a set of delay circuits 110, 112, 114, 116 logically coupled in a chain configuration, (a) where each of delay circuits 110, 112, 114, 116 includes a delay input and a delay output, (b) where the delay input of a first delay circuit 110 in the set is logically coupled to a programmable delay circuit output of a programmable delay circuit 190, (c) where the delay input of a second delay circuit 112 in the set is logically coupled to the delay output of first delay circuit 110, (d) where the delay input of each of the remaining delay circuits 114, 116 in the set is logically coupled to the delay output of an immediately previous delay circuit among the set, (2) a plurality of flip-flop circuits 120, 122, 124, 126, 128, 130 logically coupled to the delay output of the each of delay circuits 110, 112, 114, 116 respectively, forming tiers 140, 142 of flip-flop circuits, (a) where each of flip-flop circuits 120, 122, 124, 126, 128, 130 includes a flip-flop input, a clock input, and a flip-flop output, (b) where the flip-flop input of the each of the plurality of flip-flop circuits 120, 122, 124, 126, 128, 130 is logically coupled to the delay output of the each of delay circuits 110, 112, 114, 116 respectively, (3) a clock circuit 150, 152 logically coupled to each of tiers 140, 142 of flip-flop circuits respectively, (a) where a clock output of clock circuit 150, 152 is logically coupled to the clock input of each flip-flop circuit 120, 124, 128, 122, 126, 130 in the each of tiers 140, 142 of flip-flop circuits, (b) where clock circuit 150, 152 is logically configured to transmit a skewed clock signal including a programmable delay from the clock output of clock circuit 150, 152 to the clock input of the each flip-flop circuit 120, 124, 128, 122, 126, 130 in the each of tiers 140, 142 of flip-flop circuits, resulting in skewed clock signals including corresponding programmable delays being transmitted by clock circuits 150, 152 to tiers 140, 142 of flip-flop circuits respectively, and (4) where the plurality of flip-flop circuits 120, 122, 124, 126, 128, 130 is logically configured, in response to receiving an output from the delay output of the each of delay circuits 110, 112, 114, 116 on the flip-flop input of the each of the plurality of flip-flop circuits 120, 122, 124, 126, 128, 130 in response to the delay input of first delay circuit 110 in the set of delay circuits 110, 112, 114, 116 receiving an output from the programmable delay circuit output of programmable delay circuit 190 and in response to receiving the skewed clock signals from clock circuits 150, 152 on the clock input of each flip-flop circuit 120, 124, 128, 122, 126, 130 in the each of tiers 140, 142 of flip-flop circuits, to indicate, via the flip-flop outputs of the plurality of flip-flop circuits 120, 122, 124, 126, 128, 130, how far within the plurality of flip-flop circuits 120, 122, 124, 126, 128, 130 an edge signal transmitted from the delay output of the each of delay circuits 110, 112, 114, 116 propagated, respectively.

In a particular embodiment, the each of delay circuits 110, 112, 114, 116 includes at least two inverter circuits. In a specific embodiment, each of delay circuits 110, 112, 114, 116 includes at least two inverter circuits. For example, programmable delay circuit 190 could output a rising edge signal/clock signal. In another example, at least two flip-flop circuits could be logically coupled to the delay output of each of the delay circuits. In another example, between two and eight flip-flop circuits could be logically coupled to the delay output of each of the delay circuits. In a specific embodiment, flip-flop circuits 120, 122, 124, 126, 128, 130 are master-slave digital logic elements that capture data on their flip-flop inputs when flip-flop circuits 120, 122, 124, 126, 128, 130 receive a rising edge on their clock inputs/clock ports.

In an embodiment, logical couplings include electrical connections, optical connections, wireless connections, and electro-magnetic connections. In addition, the present invention is not limited to the number of components depicted in the Figures.

In an embodiment, the present invention uses a single chain of inverters, with multiple sets of capturing latches where each set of latches is clocked by a different clock signal, and where the different clocks are skewed by small amounts of time. By using such scheme, the present invention could increase the resolution of a time-based sensor (SKITTER monitor/CPM), since signal propagation could be counted more accurately. The present invention provides a system and a method of using a proper combination of latches and skewed clocks and of setting the skew values. In an embodiment, the present invention provides a time-based sensor that uses a chain of delay blocks (inverter pairs) and latches to measure the propagation time of a signal. For example, an input signal (usually a digital 0-to-1 transition) could be applied at the input of the inverter chain at the start of the clock cycle, starting to travel down the chain of inverters, and at the end of the cycle, the latches could capture the output of the delay blocks, such that the states of the latches carry information about parameters such as the cycle time of the used clock and the power supply voltage value.

In an embodiment, the present invention provides a circuit/system and a method for measuring the propagation time of an input digital signal, including delay blocks (inverter pairs) and capturing latches or flip-flops, formed in a way such that the output of each delay block is captured by multiple latches or flip-flops, each being clocked with a different clock signal. In a further embodiment, the present invention further includes local clock buffers and inverters to generate the different clock signals, as well as programmable capacitive loads at each inverter input to create the required skew between the capturing clock signals of the latches or flip-flops.

In an embodiment, the present invention includes multiple latches at each CPM tap delay point, where different latches receive skewed versions of the same clock (as generated/controlled by a programmable delay) such that by effectively taking multiple parallel measurements at each tap, the resolution at each tap could be increased, and the overall resolution could be increased. In an embodiment, the present invention provides a system and method of generating the required skewed clocks.

In an embodiment, the present invention includes multiple latches at each tap point of a time-based monitor (e.g., SKITTER monitor, CPM), where each of the latch receives a clock of the same frequency but slightly different arrival time (skew), resulting in multiple 0/1 bits per tap. By combining these multiple bits, the present invention could indicate how far inside each tap the edge signal made it, thereby effectively increasing the resolution of the time-based monitor.

Method

Figure 2A:
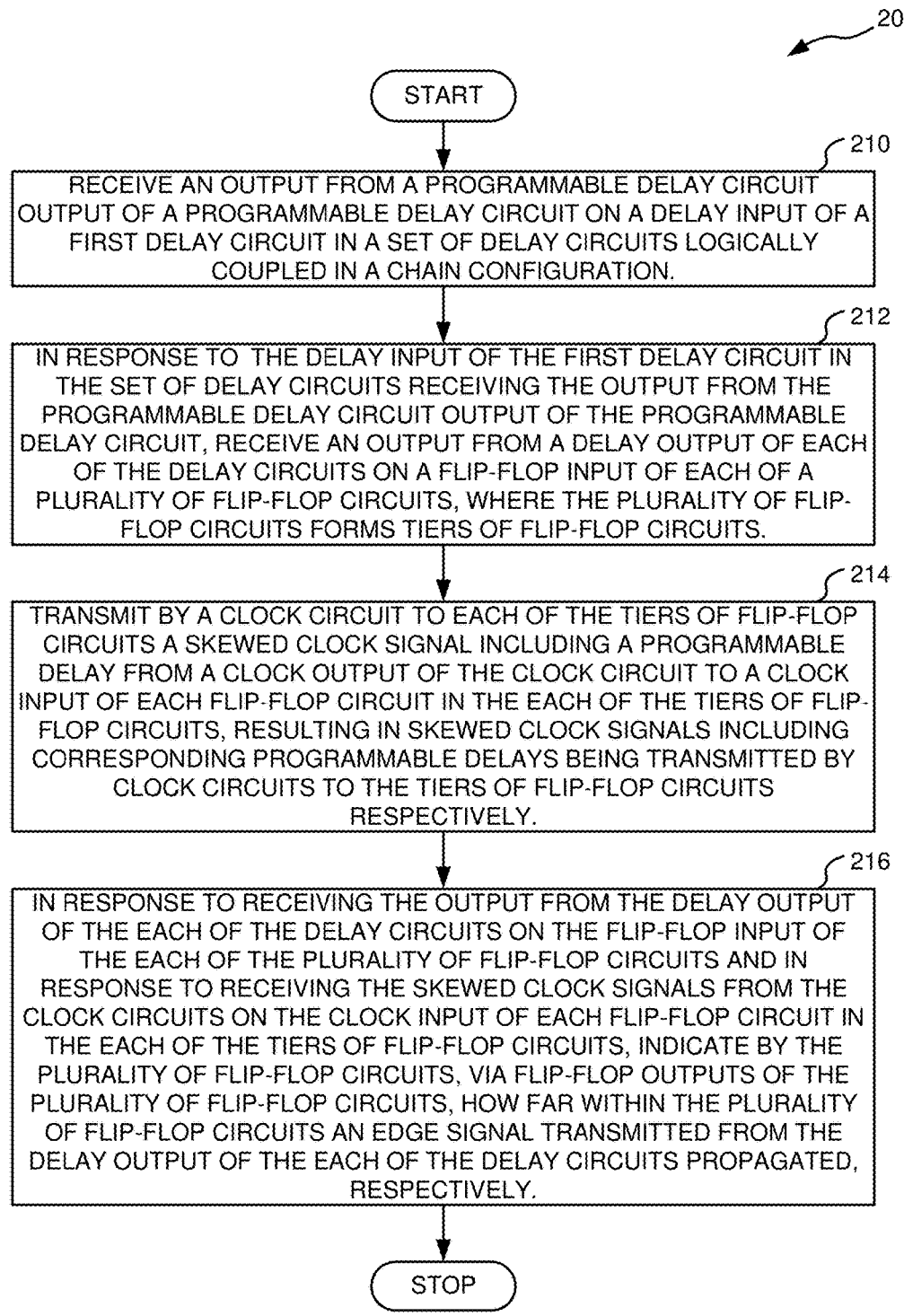
FIG. 2A depicts a flowchart in accordance with an exemplary embodiment of the present invention.

Referring to FIG. 2A, in an exemplary embodiment, the present invention provides a method 200 of increasing the resolution of on-chip timing uncertainty measurements. In an exemplary embodiment, method 200 includes (1) an operation 210 of receiving an output from a programmable delay circuit output of a programmable delay circuit on a delay input of a first delay circuit in a set of delay circuits logically coupled in a chain configuration, (2) an operation 212 of in response to the delay input of the first delay circuit in the set of delay circuits receiving the output from the programmable delay circuit output of the programmable delay circuit, receiving an output from a delay output of each of the delay circuits on a flip-flop input of each of a plurality of flip-flop circuits, where the plurality of flip-flop circuits forms tiers of flip-flop circuits, (3) an operation 214 of transmitting by a clock circuit to each of the tiers of flip-flop circuits a skewed clock signal including a programmable delay from a clock output of the clock circuit to a clock input of each flip-flop circuit in the each of the tiers of flip-flop circuits, resulting in skewed clock signals including corresponding programmable delays being transmitted by clock circuits to the tiers of flip-flop circuits respectively, and an operation 216 of in response to receiving the output from the delay output of the each of the delay circuits on the flip-flop input of the each of the plurality of flip-flop circuits and in response to receiving the skewed clock signals from the clock circuits on the clock input of each flip-flop circuit in the each of the tiers of flip-flop circuits, indicating by the plurality of flip-flop circuits, via flip-flop outputs of the plurality of flip-flop circuits, how far within the plurality of flip-flop circuits an edge signal transmitted from the delay output of the each of the delay circuits propagated, respectively.

In an embodiment, system 100 performs operation 210 of receiving an output from a programmable delay circuit output of programmable delay circuit 190 on a delay input of first delay circuit 110 in a set of delay circuits 110, 112, 114, 116 logically coupled in a chain configuration. In an embodiment, system 100 performs operation 212 of in response to the delay input of first delay circuit 110 in the set of delay circuits 110, 112, 114, 116 receiving the output from the programmable delay circuit output of programmable delay circuit 190, receiving an output from a delay output of each of delay circuits 110, 112, 114, 116 on a flip-flop input of each of a plurality of flip-flop circuits 120, 122, 124, 126, 128, 130, where the plurality of flip-flop circuits 120, 124, 128, 122, 126, 130 forms tiers 140, 142 of flip-flop circuits. In an embodiment, system 100 performs operation 214 of transmitting by a clock circuit 150, 152 to each of tiers 140, 142 of flip-flop circuits a skewed clock signal including a programmable delay from a clock output of clock circuit 150, 152 to a clock input of each flip-flop circuit 120, 124, 128, 122, 126, 130 in the each of tiers 140, 142 of flip-flop circuits, resulting in skewed clock signals including corresponding programmable delays being transmitted by clock circuits 150, 152 to tiers 140, 142 of flip-flop circuits respectively. In an embodiment, system 100 performs operation 216 of in response to receiving the output from the delay output of the each of delay circuits 110, 112, 114, 116 on the flip-flop input of the each of the plurality of flip-flop circuits 120, 122, 124, 126, 128, 130 and in response to receiving the skewed clock signals from clock circuits 150, 152 on the clock input of each flip-flop circuit 120, 124, 128, 122, 126, 130 in the each of tiers 140, 142 of flip-flop circuits, indicating by the plurality of flip-flop circuits 120, 122, 124, 126, 128, 130, via flip-flop outputs of the plurality of flip-flop circuits 120, 122, 124, 126, 128, 130, how far within the plurality of flip-flop circuits 120, 122, 124, 126, 128, 130 an edge signal transmitted from the delay output of the each of the delay circuits 110, 112, 114, 116 propagated, respectively.

Figure 2B:
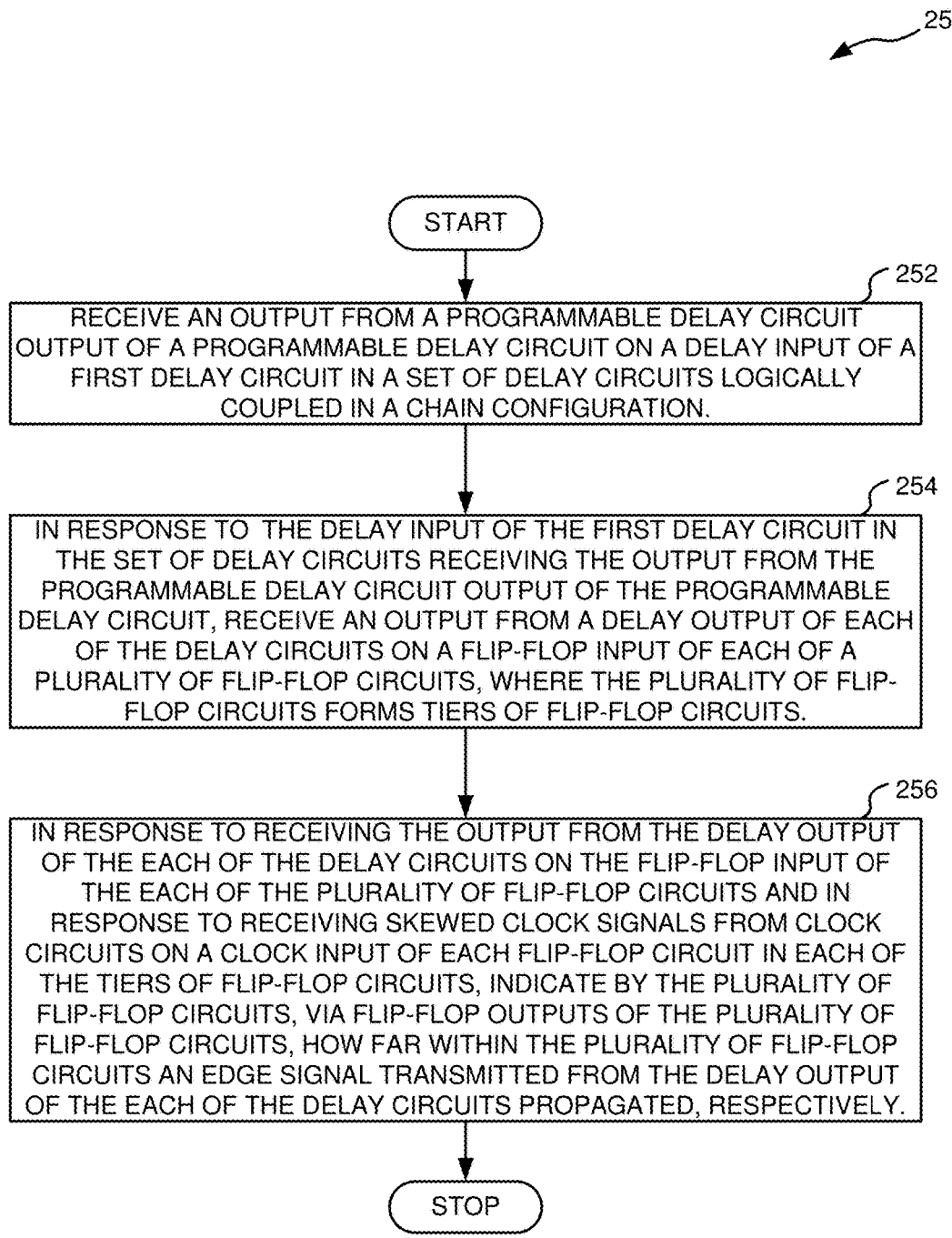
FIG. 2B depicts a flowchart in accordance with an exemplary embodiment of the present invention.

Referring to FIG. 2B, in an alternative embodiment, the present invention provides a method 250 of increasing the resolution of on-chip timing uncertainty measurements. In an alternative embodiment, method 250 includes (1) an operation 252 of receiving an output from a programmable delay circuit output of a programmable delay circuit on a delay input of a first delay circuit in a set of delay circuits logically coupled in a chain configuration, (2) an operation 254 of in response to the delay input of the first delay circuit in the set of delay circuits receiving the output from the programmable delay circuit output of the programmable delay circuit, receiving an output from a delay output of each of the delay circuits on a flip-flop input of each of a plurality of flip-flop circuits, where the plurality of flip-flop circuits forms tiers of flip-flop circuits, and (3) an operation 256 of in response to receiving the output from the delay output of the each of the delay circuits on the flip-flop input of the each of the plurality of flip-flop circuits and in response to receiving skewed clock signals from clock circuits on a clock input of each flip-flop circuit in each of the tiers of flip-flop circuits, indicating by the plurality of flip-flop circuits, via flip-flop outputs of the plurality of flip-flop circuits, how far within the plurality of flip-flop circuits an edge signal transmitted from the delay output of the each of the delay circuits propagated, respectively.

In an embodiment, system 100 performs operation 252 of receiving an output from a programmable delay circuit output of programmable delay circuit 190 on a delay input of first delay circuit 110 in a set of delay circuits 110, 112, 114, 116 logically coupled in a chain configuration. In an embodiment, system 100 performs operation 254 of in response to the delay input of first delay circuit 110 in the set of delay circuits 110, 112, 114, 116 receiving the output from the programmable delay circuit output of programmable delay circuit 190, receiving an output from a delay output of each of delay circuits 110, 112, 114, 116 on a flip-flop input of each of a plurality of flip-flop circuits 120, 122, 124, 126, 128, 130, where the plurality of flip-flop circuits 120, 124, 128, 122, 126, 130 forms tiers 140, 142 of flip-flop circuits. In an embodiment, system 100 performs operation 256 of in response to receiving the output from the delay output of the each of delay circuits 110, 112, 114, 116 on the flip-flop input of the each of the plurality of flip-flop circuits 120, 122, 124, 126, 128, 130 and in response to receiving skewed clock signals from clock circuits 150, 152 on a clock input of each flip-flop circuit 120, 124, 128, 122, 126, 130 in each of tiers 140, 142 of flip-flop circuits, indicating by the plurality of flip-flop circuits 120, 122, 124, 126, 128, 130, via flip-flop outputs of the plurality of flip-flop circuits 120, 122, 124, 126, 128, 130, how far within the plurality of flip-flop circuits 120, 122, 124, 126, 128, 130 an edge signal transmitted from the delay output of the each of the delay circuits 110, 112, 114, 116 propagated, respectively.

In a further embodiment, method 250 includes an operation of transmitting by a clock circuit to the each of the tiers of flip-flop circuits a skewed clock signal including a programmable delay from a clock output of the clock circuit to a clock input of each flip-flop circuit in the each of the tiers of flip-flop circuits, resulting in skewed clock signals including corresponding programmable delays being transmitted by the clock circuits to the tiers of flip-flop circuits respectively. In an embodiment, system 100 performs the operation of transmitting by a clock circuit 150, 152 to each of tiers 140, 142 of flip-flop circuits a skewed clock signal including a programmable delay from a clock output of clock circuit 150, 152 to a clock input of each flip-flop circuit 120, 124, 128, 122, 126, 130 in the each of tiers 140, 142 of flip-flop circuits, resulting in skewed clock signals including corresponding programmable delays being transmitted by clock circuits 150, 152 to tiers 140, 142 of flip-flop circuits respectively.

Generating Skewed Clock Signals
  Via Programmable Delays

In an exemplary embodiment, the clock circuit includes (a) a local clock buffer circuit corresponding to the each of the tiers of flip-flop circuits, (i) where the local clock buffer circuit includes a local clock buffer input and a local clock buffer output, (ii) where the local clock buffer input of the local clock buffer circuit is logically coupled to an output of a master clock circuit, (b) a set of inverter circuits logically coupled in a chain configuration corresponding to the each of the tiers of flip-flop circuits, (i) where each of the inverter circuits includes an inverter input and an inverter output, (ii) where the inverter input of a first inverter circuit in the set of inverter circuits is logically coupled to the local clock buffer output of the local clock buffer circuit, (iii) where the inverter input of a second inverter circuit in the set of inverter circuits is logically coupled to the inverter output of the first inverter circuit, (iv) where the inverter input of each of the remaining inverter circuits in the set of inverter circuits is logically coupled to the inverter output of an immediately previous inverter circuit in the set of inverter circuits, (c) a set of pass gate circuits and dummy load circuits logically coupled to the inverter output of each of the inverter circuits in the set of inverter circuits corresponding to the each of the tiers of flip-flop circuits, where the set of pass gate circuits and dummy load circuits is logically configured to generate the programmable delay of the skewed clock signal in response to control lines of the set of pass gate circuits and dummy load circuits receiving control signals, and (d) where the inverter output of a last inverter circuit in the set of inverter circuits is logically configured, in response to the inverter input of the first inverter circuit in the set of inverter circuits receiving an output from the local clock buffer output of the local clock buffer circuit and in response to the set of pass gate circuits and dummy load circuits generating the programmable delay of the skewed clock signal, to transmit the skewed clock signal to the each of the tiers of flip-flop circuits. For example, the dummy load circuits could be at least one of inverter circuits, capacitors, and variable capacitive loads.

Figure 3A:
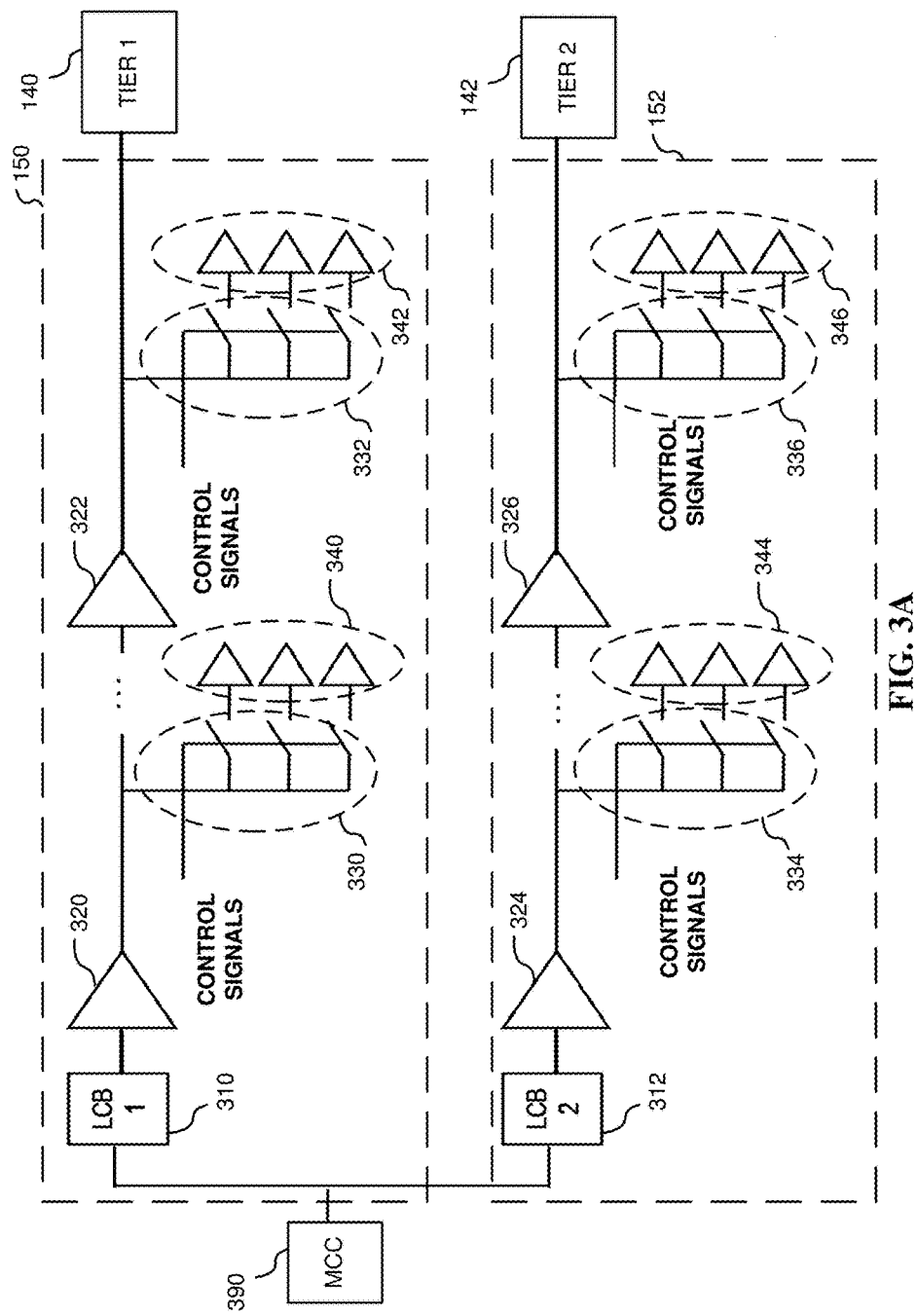
FIG. 3A depicts a block diagram in accordance with an exemplary embodiment of the present invention.

Referring to FIG. 3A, in an exemplary embodiment, clock circuit 150, 152 includes (a) a local clock buffer circuit 310, 312 (e.g., LCB 1, LCB 2) corresponding to the each of tiers 140, 142 of flip-flop circuits (e.g., TIER 1, TIER 2), (i) where local clock buffer circuit 310, 312 includes a local clock buffer input and a local clock buffer output, (ii) where the local clock buffer input of local clock buffer circuit 310, 312 is logically coupled to an output of a master clock circuit (MCC) 390, (b) a set of inverter circuits 320, 322, 324, 326 logically coupled in a chain configuration corresponding to the each of the tiers 140, 142 of flip-flop circuits, (i) where each of inverter circuits 320, 322, 324, 326 includes an inverter input and an inverter output, (ii) where the inverter input of a first inverter circuit 320, 324 in the set of inverter circuits is logically coupled to the local clock buffer output of local clock buffer circuit 310, 312, (iii) where the inverter input of a second inverter circuit in the set of inverter circuits is logically coupled to the inverter output of first inverter circuit 320, 324, (iv) where the inverter input of each of the remaining inverter circuits in the set of inverter circuits is logically coupled to the inverter output of an immediately previous inverter circuit in the set of inverter circuits, (c) a set of pass gate circuits 330, 332, 334, 336 and dummy load circuits 340, 342, 344, 346 logically coupled to the inverter output of each of inverter circuits 320, 322, 324, 326 in the set of inverter circuits corresponding to the each of tiers 140, 142 of flip-flop circuits, where the set of pass gate circuits 330, 332, 334, 336 and dummy load circuits 340, 342, 344, 346 is logically configured to generate the programmable delay of the skewed clock signal in response to control lines of the set of pass gate circuits 330, 332, 334, 336 and dummy load circuits 340, 342, 344, 346 receiving control signals, and (d) where the inverter output of a last inverter circuit 322, 326 in the set of inverter circuits is logically configured, in response to the inverter input of first inverter circuit 320, 324 in the set of inverter circuits receiving an output from the local clock buffer output of local clock buffer circuit 310, 312 and in response to the set of pass gate circuits 330, 332,

334, 336 and dummy load circuits 340, 342, 344, 346 generating the programmable delay of the skewed clock signal, to transmit the skewed clock signal to the each of tiers 140, 142 of flip-flop circuits. For example, by setting the delay on local clock buffer circuit 310 to zero (switching off the set of pass gate circuits 330, 332 and set of dummy load circuit 340, 342 via control signals received by the set of pass gate circuits 330, 332), the present invention could control the skew by increasing the delay on local clock buffer circuit 312 (switching on at least one of the set of pass gate circuits 334, 336 and set of dummy load circuit 344, 346 via control signals received by the set of pass gate circuits 334, 336).

Figure 3B:
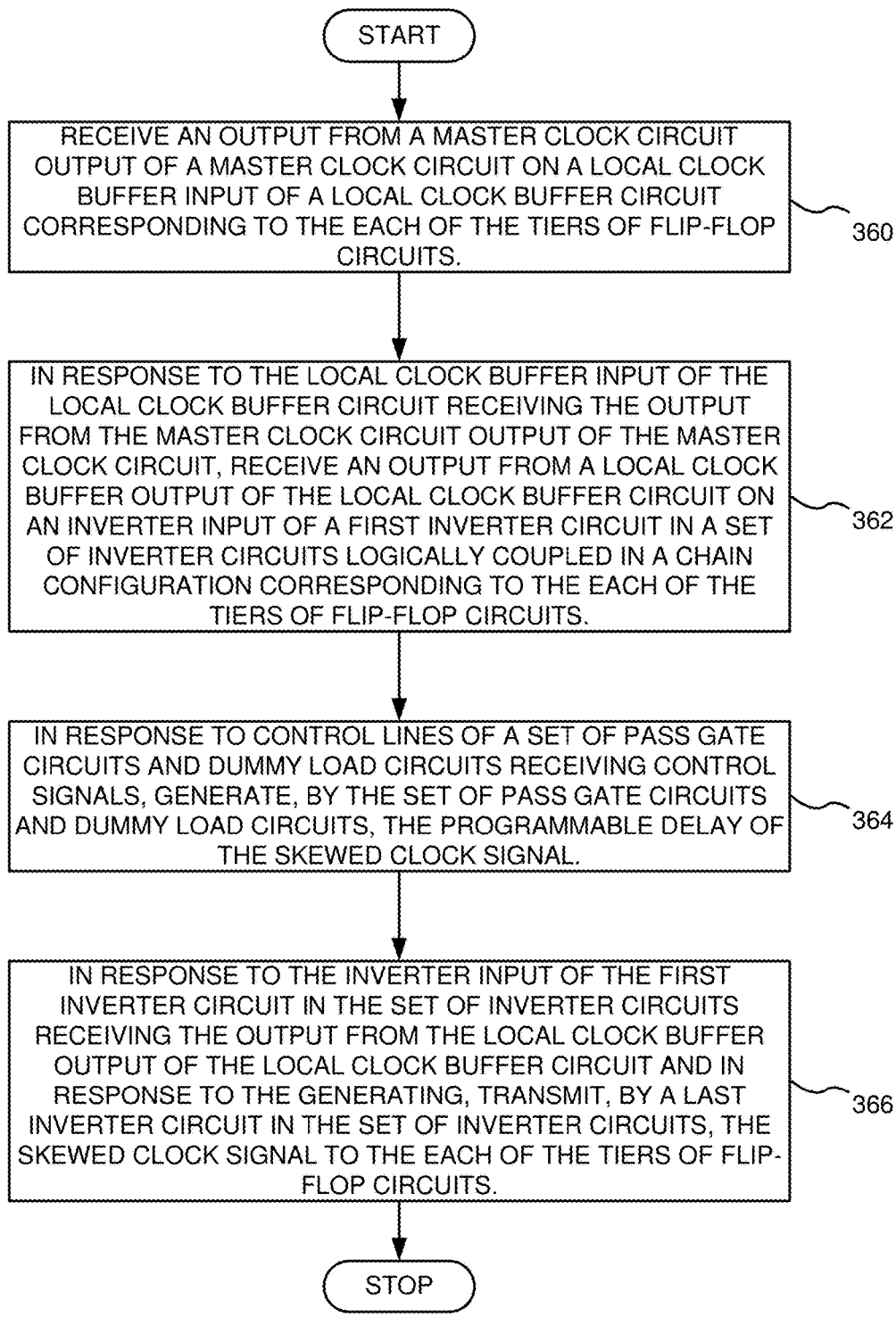
FIG. 3B depicts a flowchart in accordance with an exemplary embodiment of the present invention.

In an exemplary embodiment, the transmitting includes (a) receiving an output from a master clock circuit output of a master clock circuit on a local clock buffer input of a local clock buffer circuit corresponding to the each of the tiers of flip-flop circuits, (b) in response to the local clock buffer input of the local clock buffer circuit receiving the output from the master clock circuit output of the master clock circuit, receiving an output from a local clock buffer output of the local clock buffer circuit on an inverter input of a first inverter circuit in a set of inverter circuits logically coupled in a chain configuration corresponding to the each of the tiers of flip-flop circuits, (c) in response to control lines of a set of pass gate circuits and dummy load circuits receiving control signals, generating, by the set of pass gate circuits and dummy load circuits, the programmable delay of the skewed clock signal, and (d) in response to the inverter input of the first inverter circuit in the set of inverter circuits receiving the output from the local clock buffer output of the local clock buffer circuit and in response to the generating, transmitting, by a last inverter circuit in the set of inverter circuits, the skewed clock signal to the each of the tiers of flip-flop circuits. Referring to FIG. 3B, in an exemplary embodiment, transmitting operation 214 includes (a) an operation 360 of receiving an output from a master clock circuit output of a master clock circuit on a local clock buffer input of a local clock buffer circuit corresponding to the each of the tiers of flip-flop circuits, (b) an operation 362 of in response to the local clock buffer input of the local clock buffer circuit receiving the output from the master clock circuit output of the master clock circuit, receiving an output from a local clock buffer output of the local clock buffer circuit on an inverter input of a first inverter circuit in a set of inverter circuits logically coupled in a chain configuration corresponding to the each of the tiers of flip-flop circuits, (c) an operation 364 of in response to control lines of a set of pass gate circuits and dummy load circuits receiving control signals, generating, by the set of pass gate circuits and dummy load circuits, the programmable delay of the skewed clock signal, and (d) an operation 366 of in response to the inverter input of the first inverter circuit in the set of inverter circuits receiving the output from the local clock buffer output of the local clock buffer circuit and in response to the generating, transmitting, by a last inverter circuit in the set of inverter circuits, the skewed clock signal to the each of the tiers of flip-flop circuits.

In an embodiment, clock circuit 150, 152 performs operation 360 of receiving an output from a master clock circuit output of master clock circuit 390 on a local clock buffer input of local clock buffer circuit 310, 312 corresponding to the each of tiers 140, 142 of flip-flop circuits. In an embodiment, clock circuit 150, 152 performs operation 362 of in response to the local clock buffer input of local clock buffer circuit 310, 312 receiving the output from the master clock circuit output of master clock circuit 390, receiving an output from a local clock buffer output of local clock buffer circuit 310, 312 on an inverter input of first inverter circuit 320, 324 in a set of inverter circuits 320, 322, 324, 326 logically coupled in a chain configuration corresponding to the each of tiers 140, 142 of flip-flop circuits. In an embodiment, clock circuit 150, 152 performs operation 364 of in response to control lines of a set of pass gate circuits 330, 332, 334, 336 and dummy load circuits 340, 342, 344, 346 receiving control signals, generating, by the set of pass gate circuits 330, 332, 334, 336 and dummy load circuits 340, 342, 344, 346, the programmable delay of the skewed clock signal. In an embodiment, clock circuit 150, 152 performs operation 366 of in response to the inverter input of first inverter circuit 320, 324 in the set of inverter circuits 320, 322, 324, 326 receiving the output from the local clock buffer output of local clock buffer circuit 310, 312 and in response to the generating, transmitting, by last inverter circuit 322, 326 in the set of inverter circuits 320, 322, 324, 326, the skewed clock signal to the each of tiers 140, 142 of flip-flop circuits.

Via Different Voltage Supply Values

In an exemplary embodiment, the clock circuit includes (a) a local clock buffer circuit corresponding to the each of the tiers of flip-flop circuits, (i) where the local clock buffer circuit includes a local clock buffer input, a voltage supply input, and a local clock buffer output, (ii) where the local clock buffer input of the local clock buffer circuit is logically coupled to a master clock circuit output of a master clock circuit, (b) a programmable header circuit electrically coupled to the voltage supply input of the local clock buffer circuit corresponding to the each of the tiers of flip-flop circuits, where the programmable header circuit is electrically configured to generate the programmable delay of the skewed clock signal, and (c) where the local clock buffer output of the local clock buffer circuit is logically configured, in response to the local clock buffer input of the local clock buffer circuit receiving an output from the master clock circuit output of the master clock circuit and in response to the programmable header circuit generating the programmable delay of the skewed clock signal, to transmit the skewed clock signal to the each of the tiers of flip-flop circuits. In a particular embodiment, the programmable header circuit includes at least one transistor. In a particular embodiment, the at least one transistor is a p-MOS transistor. For example, the programmable header circuits could provide different voltage supplies to their respective local clock buffer circuits. In a specific example, the programmable header circuits have different strengths. In a further example, the programmable header circuits have different strengths proportional to the number of transistors in the programmable header circuits, respectively.

Figure 4A:
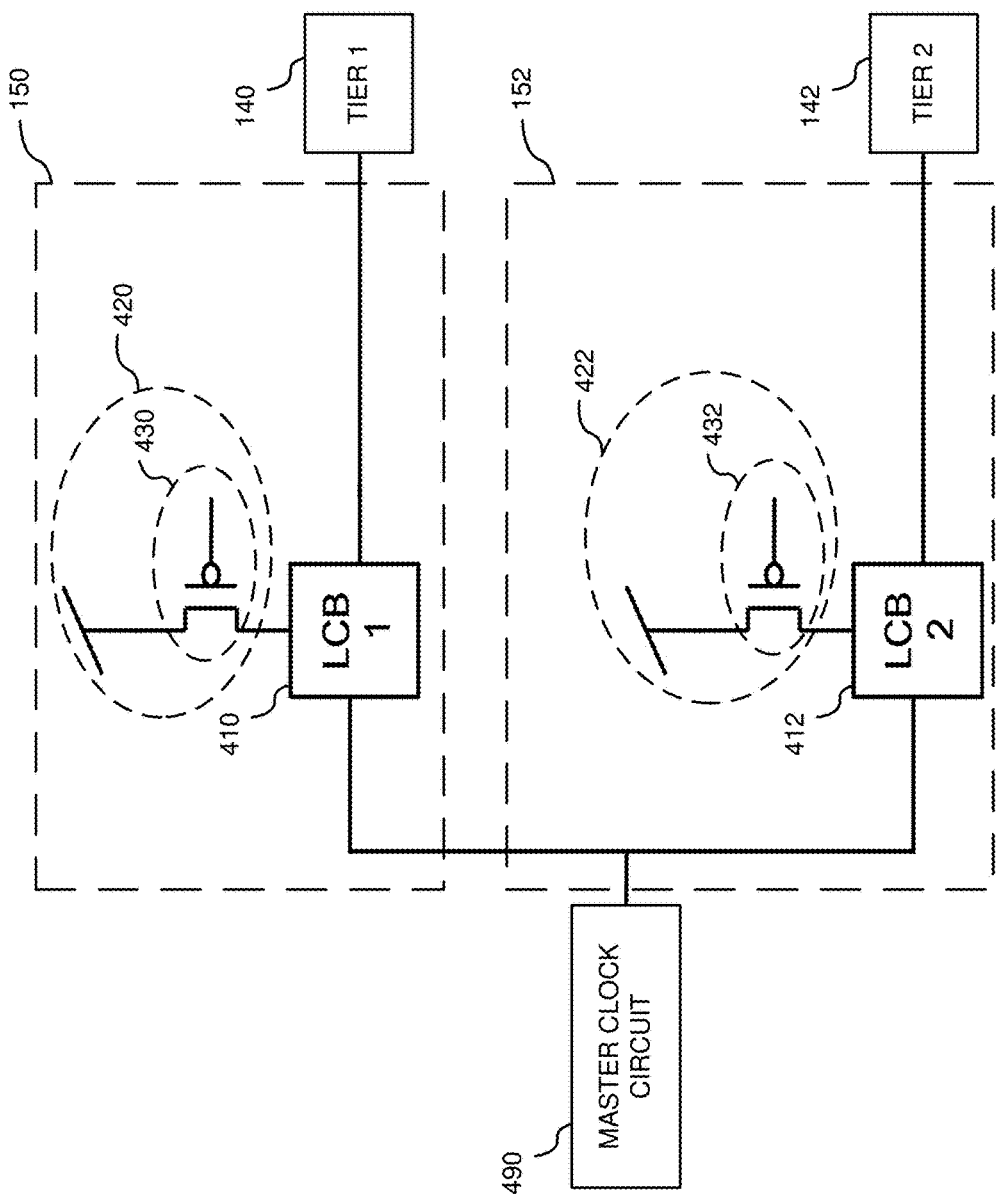
FIG. 4A depicts a block diagram in accordance with an exemplary embodiment of the present invention.

Referring to FIG. 4A, in an exemplary embodiment, clock circuit 150, 152 includes (a) a local clock buffer circuit 410, 412 (e.g., LCB 1, LCB 2) corresponding to the each of the tiers 140, 142 of flip-flop circuits (e.g., TIER 1, TIER 2), (i) where local clock buffer circuit 410, 412 includes a local clock buffer input, a voltage supply input, and a local clock buffer output, (ii) where the local clock buffer input of local clock buffer circuit 410, 412 is logically coupled to a master clock circuit output of a master clock circuit 490, (b) a programmable header circuit 420, 422 electrically coupled to the voltage supply input of local clock buffer circuit 410, 412 corresponding to the each of the tiers 140, 142 of flip-flop circuits, where programmable header circuit 420, 422 is electrically configured to generate the programmable delay of the skewed clock signal, and where the local clock buffer output of local clock buffer circuit 410, 412 is logically configured, in response to the local clock buffer input of local clock buffer circuit 410, 412 receiving an output from the master clock circuit output of master clock circuit 490 and in response to programmable header circuit 420, 422 generating the programmable delay of the skewed clock signal, to transmit the skewed clock signal to the each of tiers 140, 142 of flip-flop circuits. In a particular embodiment, programmable header circuit 420, 422 includes at least one transistor 430, 432. In a particular embodiment, at least one transistor 430, 432 is a p-MOS transistor. For example, by setting the number of headers/transistors in programmable header circuit 420 for local clock buffer circuit 410, the present invention could control the skew by changing the number of headers/transistors in programmable header circuit 422 for local clock buffer circuit 412 (where the fewer headers/transistors set on, the smaller the supply voltage on local clock buffer circuit 412, and the larger the delay).

Figure 4B:
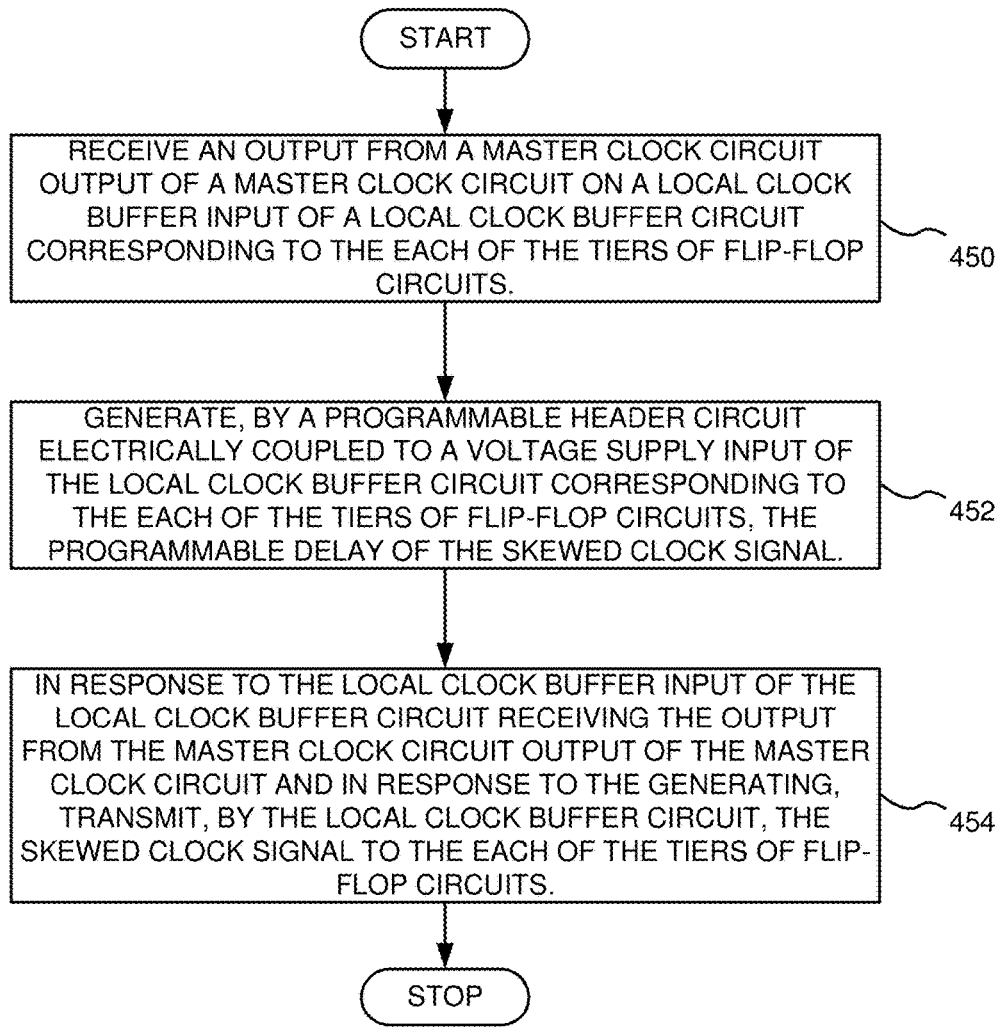
FIG. 4B depicts a flowchart in accordance with an exemplary embodiment of the present invention.

In an exemplary embodiment, the transmitting includes (a) receiving an output from a master clock circuit output of a master clock circuit on a local clock buffer input of a local clock buffer circuit corresponding to the each of the tiers of flip-flop circuits, (b) generating, by a programmable header circuit electrically coupled to a voltage supply input of the local clock buffer circuit corresponding to the each of the tiers of flip-flop circuits, the programmable delay of the skewed clock signal, and (c) in response to the local clock buffer input of the local clock buffer circuit receiving the output from the master clock circuit output of the master clock circuit and in response to the generating, transmitting, by the local clock buffer circuit, the skewed clock signal to the each of the tiers of flip-flop circuits. Referring to FIG. 4B, in an exemplary embodiment, transmitting operation 214 includes (a) an operation 450 of receiving an output from a master clock circuit output of a master clock circuit on a local clock buffer input of a local clock buffer circuit corresponding to the each of the tiers of flip-flop circuits, (b) an operation 452 of generating, by a programmable header circuit electrically coupled to a voltage supply input of the local clock buffer circuit corresponding to the each of the tiers of flip-flop circuits, the programmable delay of the skewed clock signal, and (c) an operation 454 of in response to the local clock buffer input of the local clock buffer circuit receiving the output from the master clock circuit output of the master clock circuit and in response to the generating, transmitting, by the local clock buffer circuit, the skewed clock signal to the each of the tiers of flip-flop circuits.

In an embodiment, clock circuit 150, 152 performs operation 450 of receiving an output from a master clock circuit output of master clock circuit 490 on a local clock buffer input of local clock buffer circuit 410, 412 corresponding to the each of tiers 140, 142 of flip-flop circuits. In an embodiment, clock circuit 150, 152 performs operation 452 of generating, by programmable header circuit 420, 422 electrically coupled to a voltage supply input of local clock buffer circuit 410, 412 corresponding to the each of tiers 140, 142 of flip-flop circuits, the programmable delay of the skewed clock signal. In an embodiment, clock circuit 150, 152 performs operation 454 of in response to the local clock buffer input of local clock buffer circuit 410, 412 receiving the output from the master clock circuit output of master clock circuit 490 and in response to the generating, transmitting, by local clock buffer circuit 410, 412, the skewed clock signal to the each of tiers 140, 142 of flip-flop circuits.

Example

In an embodiment, the present invention uses a chain of delay blocks where the output of each of the delay blocks block is captured by multiple latches. For example, if block-i" were the i-th delay block, then latch-i,j would be the j-th latch that captures the output of the i-th delay block. Specifically, for example, latch i,1 could capture the output at the end of the cycle, latch i,2 could capture the output at a slightly later time, and latch i,3 could capture the output at a slightly later time, and so on. In a further example, if DT were the skews between the capturing clocks of these latches, latch i,2 could capture the propagated signal DT time after latch i,1 such that the state of latch i,2 could change if the signal propagation changed by only DT, which could be made smaller than the delay of each delay block. In an embodiment, the present invention could, as a result, increase the effective resolution of the time-based sensor. Specifically, for example, the present invention could provide increased measurement resolution of on-chip timing uncertainty (perhaps with sub-picosecond resolution) without requiring multiple consecutive measurements (to increase resolution).

In an embodiment, the present invention also provides a system and a method of generating the required skews DT. In a further example, all latches that belong to the first (original) latch set latch k,1 could come from a local-clock-buffer (LCB) that drives them through a number of inverter gates with all remaining clocks, driving latches "latch k,2", "latch k,3", and so on coming from different instantiations of the same LCB and inverter gates, where programmable capacitor loads could be added to the inputs of all inverter gates. In a specific example, by switching on and off different capacitor loads, the delay of the inverter gates could be changed by a small amount, overall producing the total required skews DT, 2DT and so on.

Figure 5:
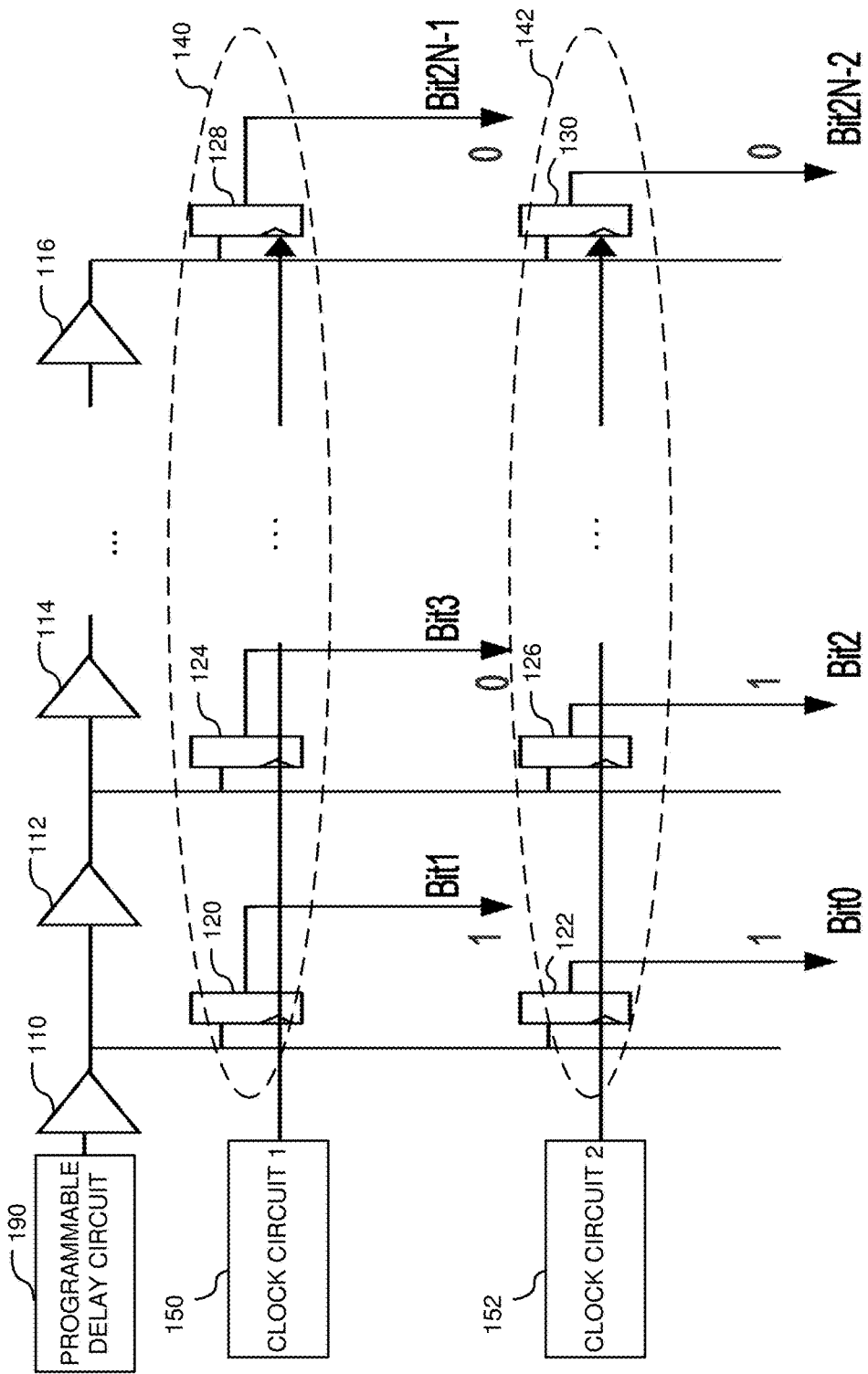
FIG. 5 depicts a block diagram in accordance with an exemplary embodiment of the present invention.

FIG. 5 depicts an example of the present invention with double or 2× resolution, wherein the rising edge of the output of programmable delay circuit 190 propagated through flip-flop circuits 120 and 122 (as indicated by the logic "1" output values of flip-flop circuits 120 and 122) and propagated through flip-flop circuit 126 (as indicated by the logic "0" output value of flip-flop circuit 124 and the logic "1" output value of flip-flop circuit 126).

Figure 6A:
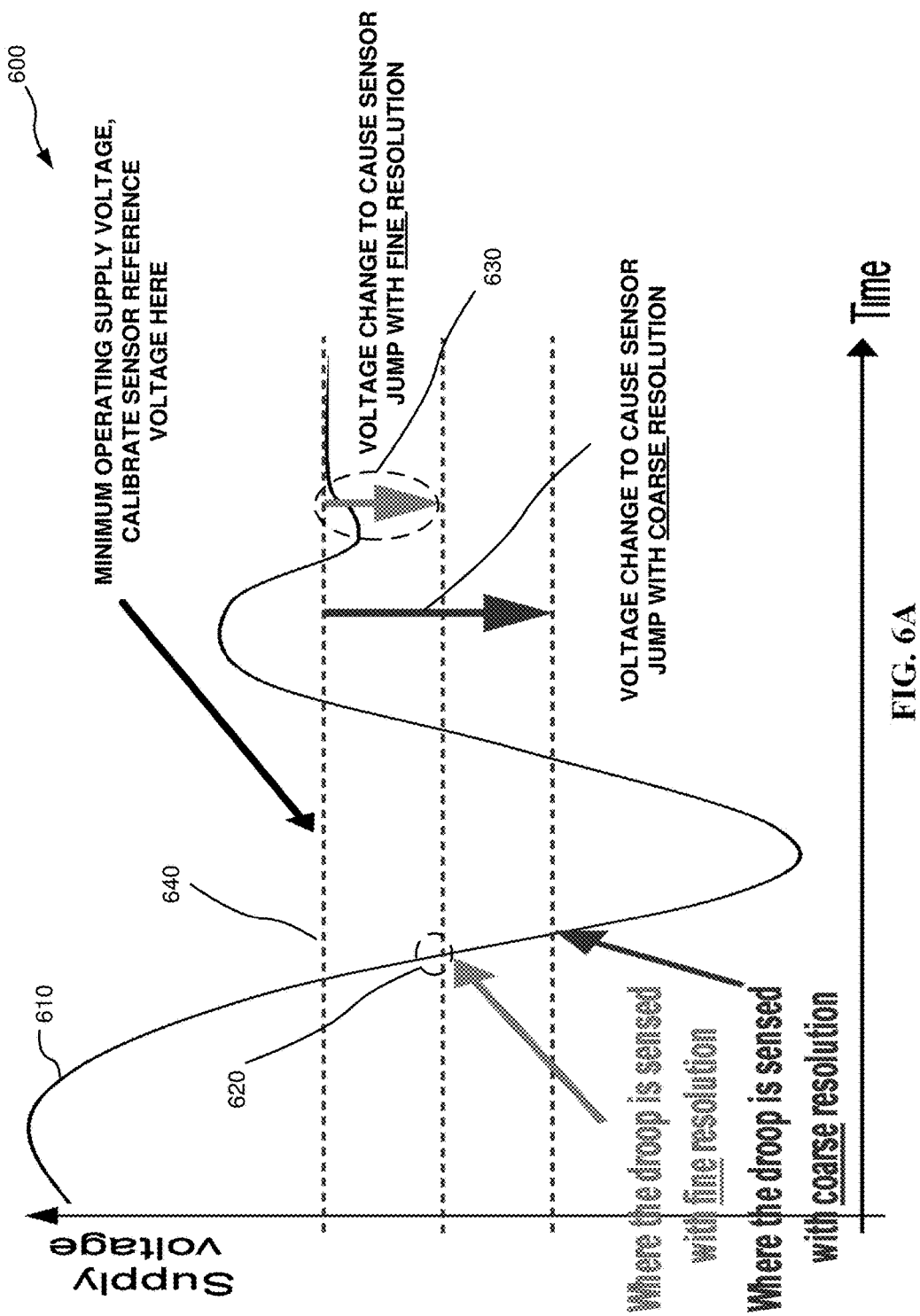
FIG. 6A depicts a graph in accordance with an exemplary embodiment of the present invention.
Figure 6B:
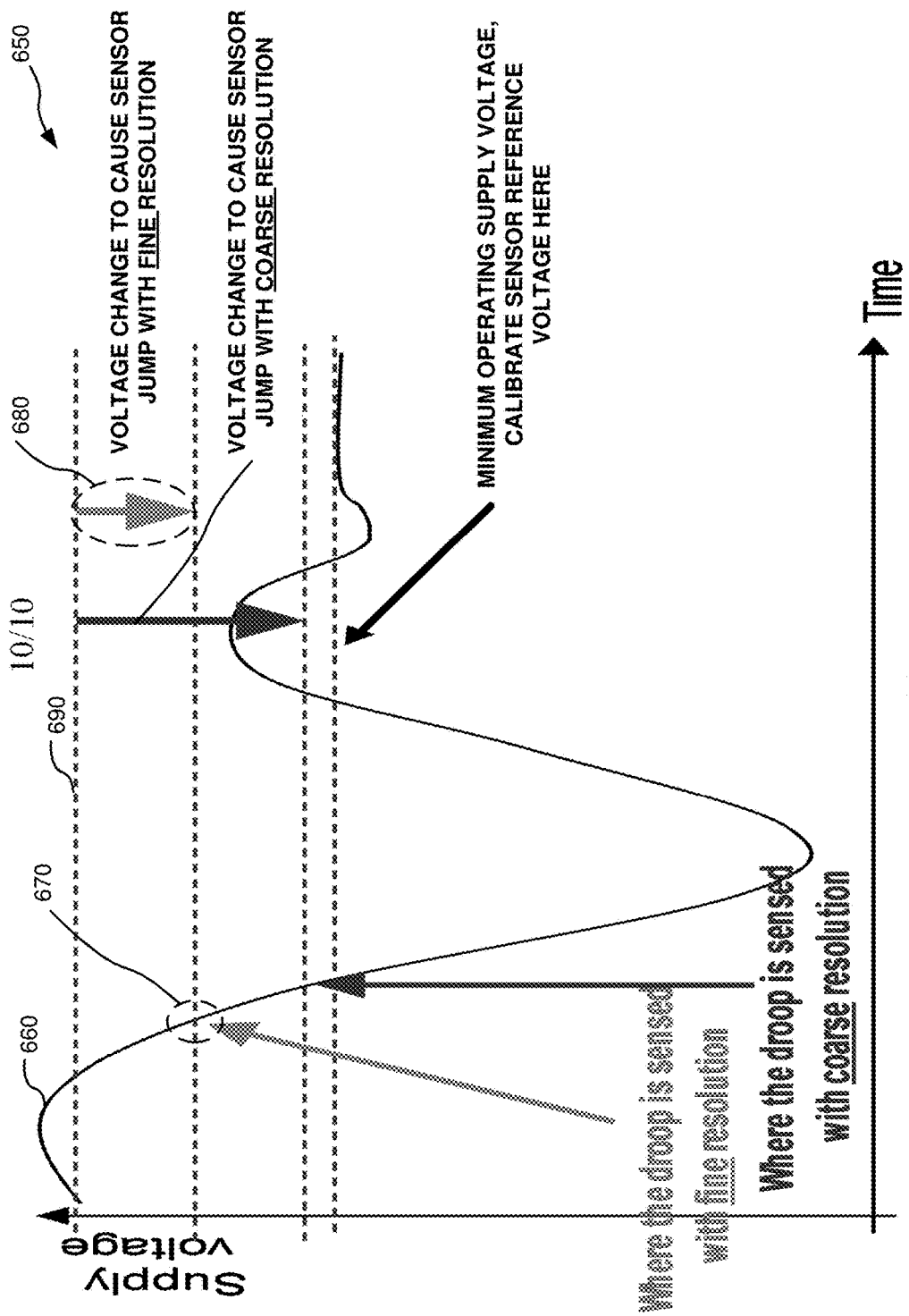
FIG. 6B depicts a graph in accordance with an exemplary embodiment of the present invention.

In another example, time resolution in a sensor (e.g., SKITTER monitor, CPM) is used to measure voltage of digital circuit via two types of sensor output processing as depicted in FIG. 6A and FIG. 6B, FIG. 6A depicts, for example, a graph 600 indicating the first type of sensor output processing, threshold processing. FIG. 6B depicts, in another example, a graph 650 indicating the second type of sensor output processing, slope processing. Typical resolution (in 22 nanometer designs or beyond, and product conditions) for CPM could be no less than 6-7 picoseconds, which for high-frequency processors can be up to 3.5% of one clock cycle. Such resolution in a single-cycle measurement could lead to a very crude voltage resolution, requiring more than 25-30 mV to change the CPM value by 1 in one cycle. Such a coarse resolution could lead to throttling very late in both threshold processing and slope processing, resulting in mitigating a small portion of the droop-related voltage margin.

Referring to FIG. 6A, for example, threshold processing involves calibrating the sensor reference voltage to the minimum safe on-chip voltage/supply voltage and throttling the voltage/supply voltage when the sensor reference voltage has a value of less than or equal to a threshold voltage. In a further example, throttling the voltage/supply voltage when the sensor reference has a value one unit of voltage less the minimum operating supply voltage could lead to many false positives. Finer resolution, as could be provided by the present invention, could lead to earlier sensing, faster reaction, and more droop mitigation. Specifically, by sensing/detecting the droop in the supply voltage earlier at point 620 of plot 610, the present invention could enable using a smaller voltage change 630 to restore the threshold voltage 640. For example, good resolution could be when voltage change 630 has an absolute value of 2 or less.

Referring to FIG. 6B, for example, slope processing involves calculating the slope of plot 660 between sensor reference values of 2 voltage units greater than the minimum operating supply voltage and the minimum operating supply voltage (e.g., 12 volts and 10 volts) and throttling the voltage/supply voltage when the jump in sensor reference values from 2 voltage units greater than the minimum operating supply voltage and the minimum operating supply voltage occurs in less than 50 cycles/clock cycles. Finer resolution, as could be provided by the present invention, could lead to earlier sensing, faster reaction, and more droop mitigation. Specifically, by sensing/detecting the droop in the supply voltage earlier at point 670 of plot 660, the present invention could enable using a smaller voltage change 680 to restore the threshold voltage 690. For example, good resolution could be when voltage change 630 has an absolute value of 2 or less occurring in short period of time.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system comprising:
    a set of delay circuits logically coupled in a chain configuration,
        wherein each of the delay circuits comprises a delay input and a delay output,
        wherein the delay input of a first delay circuit in the set is logically coupled to a programmable delay circuit output of a programmable delay circuit,
        wherein the delay input of a second delay circuit in the set is logically coupled to the delay output of the first delay circuit,
        wherein the delay input of each of the remaining delay circuits in the set is logically coupled to the delay output of an immediately previous delay circuit in the set;
    a plurality of flip-flop circuits logically coupled to the delay output of the each of the delay circuits respectively, forming tiers of flip-flop circuits,
        wherein each of the flip-flop circuits comprises a flip-flop input, a clock input, and a flip-flop output,
        wherein the flip-flop input of each of the plurality of flip-flop circuits is logically coupled to the delay output of the each of the delay circuits respectively;
    a clock circuit logically coupled to each of the tiers of flip-flop circuits respectively,
        wherein a clock output of the clock circuit is logically coupled to the clock input of each flip-flop circuit in the each of the tiers of flip-flop circuits,
        wherein the clock circuit is logically configured to transmit a skewed clock signal comprising a programmable delay from the clock output of the clock circuit to the clock input of the each flip-flop circuit in the each of the tiers of flip-flop circuits, resulting in skewed clock signals including corresponding programmable delays being transmitted by clock circuits to the tiers of flip-flop circuits respectively;
        wherein the plurality of flip-flop circuits is logically configured, in response to receiving an output from the delay output of the each of the delay circuits on the flip-flop input of the each of the plurality of flip-flop circuits in response to the delay input of the first delay circuit in the set of delay circuits receiving an output from the programmable delay circuit output of the programmable delay circuit and in response to receiving the skewed clock signals from the clock circuits on the clock input of the each flip-flop circuit in the each of the tiers of flip-flop circuits, to indicate, via the flip-flop outputs of the plurality of flip-flop circuits, how far within the plurality of flip-flop circuits an edge signal transmitted from the delay output of the each of the delay circuits propagated, respectively;
        wherein the skewed clock signals have a common frequency; and
        wherein each of the skewed clock signals has a different arrival time (skew) as determined by a corresponding programmable delay.

2. The system of claim 1 wherein the each of the delay circuits comprises at least two inverter circuits.

3. The system of claim 1 wherein the clock circuit comprises:
    a local clock buffer circuit corresponding to the each of the tiers of flip-flop circuits,
        wherein the local clock buffer circuit comprises a local clock buffer input and a local clock buffer output,
        wherein the local clock buffer input of the local clock buffer circuit is logically coupled to an output of a master clock circuit;
    a set of inverter circuits logically coupled in a chain configuration corresponding to the each of the tiers of flip-flop circuits,
        wherein each of the inverter circuits comprises an inverter input and an inverter output,
        wherein the inverter input of a first inverter circuit in the set of inverter circuits is logically coupled to the local clock buffer output of the local clock buffer circuit,
        wherein the inverter input of a second inverter circuit in the set of inverter circuits is logically coupled to the inverter output of the first inverter circuit,
        wherein the inverter input of each of the remaining inverter circuits in the set of inverter circuits is logically coupled to the inverter output of an immediately previous inverter circuit in the set of inverter circuits;
    a set of pass gate circuits and dummy load circuits logically coupled to the inverter output of each of the inverter circuits in the set of inverter circuits corresponding to the each of the tiers of flip-flop circuits,
        wherein the set of pass gate circuits and dummy load circuits is logically configured to generate the programmable delay of the skewed clock signal in response to control lines of the set of pass gate circuits and dummy load circuits receiving control signals; and wherein the inverter output of a last inverter circuit in the set of inverter circuits is logically configured, in response to the inverter input of the first inverter circuit in the set of inverter circuits receiving an output from the local clock buffer output of the local clock buffer circuit and in response to the set of pass gate circuits and dummy load circuits generating the programmable delay of the skewed clock signal, to transmit the skewed clock signal to the each of the tiers of flip-flop circuits.

4. The system of claim 1 wherein the clock circuit comprises:

a local clock buffer circuit corresponding to the each of the tiers of flip-flop circuits,
  wherein the local clock buffer circuit comprises a local clock buffer input, a voltage supply input, and a local clock buffer output,
  wherein the local clock buffer input of the local clock buffer circuit is logically coupled to a master clock circuit output of a master clock circuit;

a programmable header circuit electrically coupled to the voltage supply input of the local clock buffer circuit corresponding to the each of the tiers of flip-flop circuits, wherein the programmable header circuit is electrically configured to generate the programmable delay of the skewed clock signal; and wherein the local clock buffer output of the local clock buffer circuit is logically configured, in response to the local clock buffer input of the local clock buffer circuit receiving an output from the master clock circuit output of the master clock circuit and in response to the programmable header circuit generating the programmable delay of the skewed clock signal, to transmit the skewed clock signal to the each of the tiers of flip-flop circuits.

5. The system of claim 4 wherein the programmable header circuit comprises at least one transistor.

6. The system of claim 5 wherein the at least one transistor is a p-MOS transistor.

7. A method comprising:

receiving an output from a programmable delay circuit output of a programmable delay circuit on a delay input of a first delay circuit in a set of delay circuits logically coupled in a chain configuration;

in response to the delay input of the first delay circuit in the set of delay circuits receiving the output from the programmable delay circuit output of the programmable delay circuit, receiving an output from a delay output of each of the delay circuits on a flip-flop input of each of a plurality of flip-flop circuits, wherein the plurality of flip-flop circuits forms tiers of flip-flop circuits;

transmitting by a clock circuit to each of the tiers of flip-flop circuits a skewed clock signal comprising a programmable delay from a clock output of the clock circuit to a clock input of each flip-flop circuit in the each of the tiers of flip-flop circuits, resulting in skewed clock signals including corresponding programmable delays being transmitted by clock circuits to the tiers of flip-flop circuits respectively; and in response to receiving the output from the delay output of the each of the delay circuits on the flip-flop input of the each of the plurality of flip-flop circuits and in response to receiving the skewed clock signals from the clock circuits, indicating by the plurality of flip-flop circuits, via flip-flop outputs of the plurality of flip-flop circuits, how far within the plurality of flip-flop circuits an edge signal transmitted from the delay output of the each of the delay circuits propagated, respectively, wherein the skewed clock signals have a common frequency, and wherein each of the skewed clock signals has a different arrival time (skew) as determined by a corresponding programmable delay.

8. The method of claim 7 wherein the each of the delay circuits comprises at least two inverter circuits.

9. The method of claim 7 wherein the transmitting comprises:

receiving an output from a master clock circuit output of a master clock circuit on a local clock buffer input of a local clock buffer circuit corresponding to the each of the tiers of flip-flop circuits;

in response to the local clock buffer input of the local clock buffer circuit receiving the output from the master clock circuit output of the master clock circuit, receiving an output from a local clock buffer output of the local clock buffer circuit on an inverter input of a first inverter circuit in a set of inverter circuits logically coupled in a chain configuration corresponding to the each of the tiers of flip-flop circuits;

in response to control lines of a set of pass gate circuits and dummy load circuits receiving control signals, generating, by the set of pass gate circuits and dummy load circuits, the programmable delay of the skewed clock signal; and in response to the inverter input of the first inverter circuit in the set of inverter circuits receiving the output from the local clock buffer output of the local clock buffer circuit and in response to the generating, transmitting, by a last inverter circuit in the set of inverter circuits, the skewed clock signal to the each of the tiers of flip-flop circuits.

10. The method of claim 7 wherein the transmitting comprises:

receiving an output from a master clock circuit output of a master clock circuit on a local clock buffer input of a local clock buffer circuit corresponding to the each of the tiers of flip-flop circuits;

generating, by a programmable header circuit electrically coupled to a voltage supply input of the local clock buffer circuit corresponding to the each of the tiers of flip-flop circuits, the programmable delay of the skewed clock signal; and in response to the local clock buffer input of the local clock buffer circuit receiving the output from the master clock circuit output of the master clock circuit and in response to the generating, transmitting, by the local clock buffer circuit, the skewed clock signal to the each of the tiers of flip-flop circuits.

11. The method of claim 10 wherein the programmable header circuit comprises at least one transistor.

12. The method of claim 11 wherein the at least one transistor is a p-MOS transistor.

13. A method comprising:

receiving an output from a programmable delay circuit output of a programmable delay circuit on a delay input of a first delay circuit in a set of delay circuits logically coupled in a chain configuration;

in response to the delay input of the first delay circuit in the set of delay circuits receiving the output from the programmable delay circuit output of the programmable delay circuit, receiving an output from a delay output of each of the delay circuits on a flip-flop input of each of a plurality of flip-flop circuits, where the plurality of flip-flop circuits forms tiers of flip-flop circuits; and in response to receiving the output from the delay output of the each of the delay circuits on the flip-flop input of the each of the plurality of flip-flop circuits and in response to receiving skewed clock signals from clock circuits on a clock input of each flip-flop circuit in each of the tiers of flip-flop circuits, indicating by the plurality of flip-flop circuits, via flip-flop outputs of the plurality of flip-flop circuits, how far within the plurality of flip-flop circuits an edge signal transmitted from the delay output of the each of the delay circuits propagated, respectively;

transmitting by a clock circuit to the each of the tiers of flip-flop circuits a skewed clock signal comprising a programmable delay from a clock output of the clock circuit to a clock input of each flip-flop circuit in the each of the tiers of flip-flop circuits, resulting in skewed clock signals including corresponding programmable delays being transmitted by the clock circuits to the tiers of flip-flop circuits respectively, wherein the skewed clock signals have a common frequency, and wherein each of the skewed clock signals has a different arrival time (skew) as determined by a corresponding programmable delay.

14. The method of claim 13 wherein the each of the delay circuits comprises at least two inverter circuits.

15. The method of claim 13 wherein the transmitting comprises:

receiving an output from a master clock circuit output of a master clock circuit on a local clock buffer input of a local clock buffer circuit corresponding to the each of the tiers of flip-flop circuits;

in response to the local clock buffer input of the local clock buffer circuit receiving the output from the master clock circuit output of the master clock circuit, receiving an output from a local clock buffer output of the local clock buffer circuit on an inverter input of a first inverter circuit in a set of inverter circuits logically coupled in a chain configuration corresponding to the each of the tiers of flip-flop circuits;

in response to control lines of a set of pass gate circuits and dummy load circuits receiving control signals, generating, by the set of pass gate circuits and dummy load circuits, the programmable delay of the skewed clock signal; and in response to the inverter input of the first inverter circuit in the set of inverter circuits receiving the output from the local clock buffer output of the local clock buffer circuit and in response to the generating, transmitting, by a last inverter circuit in the set of inverter circuits, the skewed clock signal to the each of the tiers of flip-flop circuits.

16. The method of claim 13 wherein the transmitting comprises:

receiving an output from a master clock circuit output of a master clock circuit on a local clock buffer input of a local clock buffer circuit corresponding to the each of the tiers of flip-flop circuits;

generating, by a programmable header circuit electrically coupled to a voltage supply input of the local clock buffer circuit corresponding to the each of the tiers of flip-flop circuits, the programmable delay of the skewed clock signal; and in response to the local clock buffer input of the local clock buffer circuit receiving the output from the master clock circuit output of the master clock circuit and in response to the generating, transmitting, by the local clock buffer circuit, the skewed clock signal to the each of the tiers of flip-flop circuits.

\* \* \* \* \*